US011973498B2

(12) United States Patent
Walsh et al.

(10) Patent No.: US 11,973,498 B2
(45) Date of Patent: Apr. 30, 2024

(54) HIGH PERFORMANCE INDUCTIVE SENSING ALL DIGITAL PHASE LOCKED LOOP

(71) Applicant: Cypress Semiconductor Corporation, San Jose, CA (US)

(72) Inventors: Paul M. Walsh, Cork (IE); Kofi Makinwa, San Jose, CA (US); Matheus Pimenta, Brasília (BR); Çağri Gürleyük, Delfgauw (NL); Dermot Macsweeney, Cork (IE); Daniel O'Keeffe, Whitechurch (IE); Dennis Seguine, Kalispell, MT (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 18/086,193

(22) Filed: Dec. 21, 2022

(65) Prior Publication Data

US 2023/0188135 A1 Jun. 15, 2023

Related U.S. Application Data

(62) Division of application No. 16/721,222, filed on Dec. 19, 2019, now Pat. No. 11,552,635.

(60) Provisional application No. 62/850,101, filed on May 20, 2019.

(51) Int. Cl.

| | |
|---|---|
| ***H03K 17/95*** | (2006.01) |
| ***G01D 5/20*** | (2006.01) |
| ***G01R 27/26*** | (2006.01) |
| ***G01V 3/10*** | (2006.01) |

(52) U.S. Cl.
CPC ....... *H03K 17/9547* (2013.01); *G01D 5/2006* (2013.01); *G01R 27/2611* (2013.01); *G01V 3/102* (2013.01); *H03K 17/9502* (2013.01)

(58) Field of Classification Search
CPC ....... H03K 17/945–9547; H03K 17/97; G01D 5/2006; G01D 5/2026; G01D 5/2233; G01R 27/2611; G01V 3/10; G01V 3/101–102; H03L 7/099; H03L 2207/50
USPC .................................................... 324/207.15
See application file for complete search history.

(56) References Cited

U.S. PATENT DOCUMENTS

| | | | | |
|---|---|---|---|---|
| 5,791,648 A * | 8/1998 | Hohl | G06K 7/085 | 273/238 |
| 6,600,380 B1 * | 7/2003 | Guggenbuhl | G01R 27/02 | 331/65 |
| 7,035,750 B2 * | 4/2006 | de Obaldia | H03K 5/08 | 327/205 |
| 2018/0149828 A1 * | 5/2018 | Choi | G02B 7/105 | |

* cited by examiner

*Primary Examiner* — Steven L Yeninas
*Assistant Examiner* — Rahul Maini

(57) ABSTRACT

Front-end circuits that combine inductive and capacitive sensing are described. In one embodiment, an apparatus includes a plurality of inductive elements, an inductive measurement circuit, and a frequency divider circuit. The inductive measurement circuit is to output a first signal with a first frequency. The first signal is associated with an inductance change of one of the inductive elements. A feedback circuit can maintain the sinusoidal operation of the first signal. The frequency divider circuit can generate a second signal with a second frequency that is lower than the first frequency.

18 Claims, 21 Drawing Sheets

1800
1801
1803
1808
1818
1818
1818
1828
VDD
More of Same
1812
1814
1814
1816
Q6 1802
Q5 1804
Q3 1806
Vbias 1820
AGC 1810
1822
1824

HIGH PERFORMANCE INDUCTIVE SENSING ALL DIGITAL PHASE LOCKED LOOP

RELATED APPLICATIONS

This application is a divisional application of U.S. patent application Ser. No. 16/721,222, filed on Dec. 19, 2019, which claims the benefit of U.S. Provisional Application No. 62/850,101, filed May 20, 2019, both of which are incorporated by reference herein in their entirety.

BACKGROUND

An inductive sensor may be used to detect the presence and location of an object or the proximity of an object within a sensing area of the inductive sensor. For example, inductive sensing circuitry may detect the presence and location of an object proximate to an inductive sensor. There are a number of different types of inductive sensors. Inductive sensing may allow for linear encoding, rotary encoding, linear variable differential transformer (LVDT) sensing, and the like. Inductive sensing technology may enable touch and proximity detection for human interface on a wide variety of materials including both ferrous and non-ferrous metals. Detection occurs by measuring small deflections of conductive targets. Inductive sensing over metal overlays may provide the ability to design aesthetic user interfaces for products.

BRIEF DESCRIPTION OF THE DRAWINGS

The disclosure is illustrated by way of example, and not of limitation, in the figures of the accompanying drawings.

DETAILED DESCRIPTION

Figure 1:
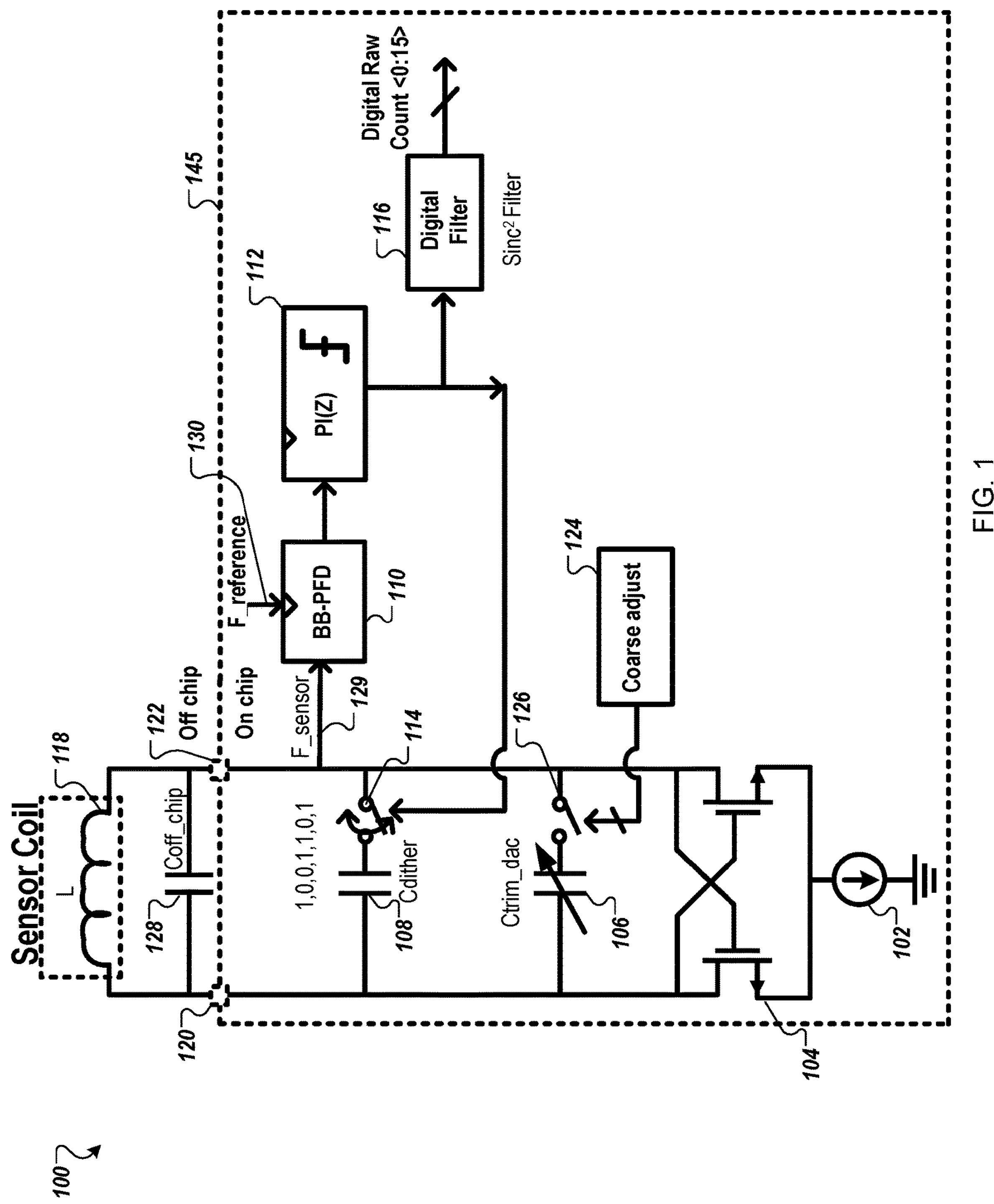
FIG. 1 is block diagram of an inductance-sensing circuit with a digital control loop to maintain a fixed frequency in a resonant circuit of the inductance-sensing circuit, according to one embodiment.

Many electronic devices include inductance sensor electrodes (also referred to herein as sense units, unit cells, sense elements, or sensor electrodes) for the user to interact with the electronic devices. For example, body-wearable devices, automatic teller machines (ATMs), information kiosks, smartphones, vending machines, washing machines, televisions, computers, and refrigerators may include sense units and corresponding inductance-sensing circuitry. When an object touches or is proximate to the sense unit, inductance-sensing circuitry may be used to capture and record the presence, location, and or proximity of the objects using the sense unit.

Unlike buttons or other mechanical controls, inductance sense units may be more sensitive and may respond differently based on a proximity of a target to the sense units. The different sense units may also respond differently to different types of objects. There are various techniques for measuring capacitance, inductance, or resistance, but these different techniques use different types of sense units and different circuits to measure capacitance, inductance, or resistance. For example, the inductive sensing may be used to detect ferrous and non-ferrous metals. Conventionally, to detect the different types of objects, a device would have to include different sense elements and different circuits to measure these different types of objects. Integration of these different sense elements and circuitry may not be feasible in terms of cost or available space within the device, especially when the device form factor is small.

The following description sets forth numerous specific details such as examples of specific systems, components, methods, and so forth, in order to provide a good understanding of various embodiments of the techniques described herein for measuring an inductance change of a sensor electrode (such as an inductance sensor electrode) and converting the inductance change to a digital value, such as used in inductive-sensing applications. It will be apparent to one skilled in the art, however, that at least some embodiments may be practiced without these specific details. In other instances, well-known components, elements, or methods are not described in detail or are presented in a simple block diagram format in order to avoid unnecessarily obscuring the techniques described herein. Thus, the specific details set forth hereinafter are merely exemplary. Particular implementations may vary from these exemplary details and still be contemplated to be within the spirit and scope of the present invention.

Reference in the description to "an embodiment," "one embodiment," "an example embodiment," "some embodiments," and "various embodiments" means that a particular feature, structure, step, operation, or characteristic described in connection with the embodiment(s) is included in at least one embodiment of the invention. Further, the appearances of the phrases "an embodiment," "one embodiment," "an example embodiment," "some embodiments," and "various embodiments" in various places in the description do not necessarily all refer to the same embodiment(s).

The description includes references to the accompanying drawings, which form a part of the detailed description. The drawings show illustrations in accordance with exemplary embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

Described herein are various embodiments of techniques for inductive sensing. The embodiments may provide a sense unit that may be used to detect different types of objects and inductive-sensing circuitry that may be used to detect these different types of object using inductive sensing. In one embodiment, the sensing unit can be used for inductive sensing. In one embodiment, the inductive sensing circuitry (also referred to herein as "inductance-sensing circuitry" or "sensing circuitry") may use a type of inductive sensing circuitry in a way that it can measure inductance of the sense element (e.g., an inductance sensor electrode), as described in more detail herein. The inductance-sensing circuit may detect ferrous and non-ferrous metal objects proximate to the sense unit using inductive sensing techniques. Examples of devices that may use inductive sensing may include, without limitation, automobiles, home appliances (e.g., refrigerators, washing machines, etc.), personal computers (e.g., laptop computers, notebook computers, etc.), mobile computing devices (e.g., tablets, tablet computers, e-reader devices, etc.), mobile communication devices (e.g., smartphones, cell phones, personal digital assistants, messaging devices, pocket PCs, etc.), connectivity and charging devices (e.g., hubs, docking stations, adapters, chargers, etc.), audio/video/data recording and/or playback devices (e.g., cameras, voice recorders, hand-held scanners, monitors, etc.), body-wearable devices, and other similar electronic devices. The embodiments described herein can be used for any inductive sensing application, including, without limitation, sensing metal proximity, sensing spring compression, in a rotary encoder, in a linear encoder, in metal over touch (MoT) applications, or the like. The embodiments described herein allow for a high dynamic range of inductance sensing.

Inductive-sensing circuitry may use one of either an impedance detection method (e.g., an Rp detection method), or an inductance detection method (e.g., an L detection method) of an inductive element (e.g., inductive coil, inductor, or the like). The impedance detection method relies on measuring a change in amplitude (e.g., voltage) or phase at a fixed driving frequency (e.g., resonant frequency, or fres), where the change in amplitude may arise from an inherent impedance associated with the inductor. In such a method, the inductive-sensing circuitry operates at a fixed resonant frequency (fres). The resonant frequency may be the resonant frequency of a resonant circuit (also referred to as an "LC tank" herein) including an inductive coil and one or more capacitors. Upon sensing a metal object proximate to the sense unit, the LC tank may have a different frequency response (e.g., the LC tank may output a sine wave with a different magnitude (e.g., change in amplitude, change in voltage) and a different resonant frequency (e.g., fres)), which can change an amplitude (of oscillation) and/or phase of the LC tank to be measured. Such a method may suffer from a large temperature drift component dominated by the coil metal (e.g., 3900 ppm/° C. for copper). Further, because the sense coils that are used may be small (e.g., less than 15 mm), the impedance may be low, which may require increasing the operating frequency up to the limit where proximity-effect losses in the coil approach DC and skin-effect loss terms. In the impedance detection method, the sensitivity may be limited by the ability to accurately demodulate and measure amplitude and phase. Clock jitter, current digital-to-analog converter (IDAC) noise, and clock precision are contributing factors to the limited sensitivity.

In one inductance-sensing circuitry, the sense method that is used may be similar to mutual capacitance sensing with two main differences. First the transmit (TX) clock signal may be shifted by 90° with respect to internal clock signals, such that a sine wave, with an associated resonant frequency (fres), that is generated by the LC tank can be demodulated. The charge may be stored and balanced on alternate cycles, e.g., while charge from one edge of the sine wave is stored, the previously stored charge (e.g., from the previous edge) is converted (e.g., balanced) to an analog current signal by the IDAC. A counter may subsequently count the time required to balance the charge. A higher resolution scan may be achieved over a larger number of clock cycles. As this inductance-sensing circuitry is based on the impedance sense method (Rp), it may be susceptible to large temperature variations. Further, the accuracy may be limited by the accuracy of the internal clock and the sensitivity may be impacted by the clock jitter. Such a configuration requires three off-chip components per inductance-sensing circuit and two off-chip components per sense channel. Such a configuration requires the use of a reference coil, which may limit its uses with devices with small form factors (e.g., body-wearable devices or other small devices), which may not have space for a reference sensing element. Further, it requires two analog to digital converters (ADCs) to digitize the output voltages and may consume a large amount of current (e.g., 11 mA at 1.8V).

Alternatively, inductance-sensing circuitry may rely on measuring a change in inductance of an LC tank. In this method (e.g., inductive sensing method), the resonant circuit, or LC tank, is driven at its resonance frequency, given by $$fres = \frac{1}{2\pi\sqrt{LC}},$$

where L is an inductance of the inductance sensing electrode of the LC tank (or resonant circuit) and C is a capacitance of the capacitor that forms the LC tank along with the inductance sensing electrode.

An inductance detection method may detect a change in inductance (e.g., when a button is pressed, causing a metal object or target (e.g., a ferrous or non-ferrous metal) to come into proximity of an inductance sensor electrode) by measuring a change in the frequency of oscillation of the LC tank away from the resonant frequency (e.g., fres). The change is frequency is detected when the oscillator output is fed into a counter to count the number of clock periods of the oscillator. The number of clock periods is compared to a reference clock (e.g., with a reference frequency) that is used to drive the system. A digital value corresponding to the number of clock periods of the oscillator may be output. The inductance detection method may suffer less from temperature drift, and offer a sensing solution with higher sensitivity.

Described herein are various embodiments of techniques for improving efficiency and sensitivity over a traditional sensor by implementing inductance-sensing circuitry with a control loop to maintain a fixed frequency in the oscillator (e.g., LC oscillator), meaning that the resonant circuit, or LC tank, operation frequency (e.g., sensor frequency, or fsen) is maintained to be the same as a reference clock frequency (e.g., reference frequency, or fref). In other words, the frequency (fsen) of a signal of an inductance-sensing circuit is maintained to be the same as the frequency (fref) of a signal of the reference clock. In one embodiment, the control loop may be a digital control loop or a digital feedback loop. In another embodiment, the control loop may be an analog control loop or an analog feedback loop. The control loop is configured to maintain a fixed frequency of the resonant circuit regardless of a distance of a metal object to the inductance sensor electrode. The reference frequency may be set to be equal to the resonance frequency of the LC tank when there is no metal object within a sensing range. An inductive sensing circuit may include an inductance-to-digital converter (LDC) that can operate over a wide possible range of sense frequencies. The LDC may be coupled to the LC tank (e.g., comprising an inductance sensor electrode (e.g., an inductor, and inductive coil, and inductive element, or the like) and a capacitor (or capacitive element). The LDC may be configured to selectively couple one or more additional capacitors to the LC tank, forming a resonant circuit with the LC tank. In the present disclosure, an operating sense frequency of the resonant circuit is maintained constant via a feedback control loop of the LDC, which may improve electromagnetic compliance (EMC) performance. The embodiments of a high performance inductive sense front end described herein may address the above-mentioned and other challenges without the additional logic and circuits and complicated protocols described above by ensuring that the resonant circuit sensor frequency (fsen) (also referred to as the sensor frequency herein) is maintained to be equal with the reference frequency (fref) upon a sense detection. In some embodiments, in order to maintain a fixed frequency of the in the resonant circuit, an LDC may include a digital control loop and a digital filter to measure an inductance change of an inductance sensor electrode. In some embodiments, the LDC may convert the inductance change to a digital value. In some embodiments, the inductance sensor electrode may form an oscillator in the digital control loop. In some embodiments, the digital control loop is configured to maintain a fixed frequency in the resonant circuit. In one embodiment, the output of the digital control loop may be proportional to the inductance change of an inductive element in the LC tank sensor. In some cases, the output of the digital control loop is not strictly proportional, as there can be a non-linear relation between the signal of the inductance-sensing circuit and the signal of the reference clock. In some embodiments, the output of the digital control loop can be considered to be dependent on the inductance change of the inductive element.

In some embodiments, the inductance-sensing circuit may include an oscillator (also referred to as an LC oscillator (LCO), an LCO circuit, or a resonant circuit herein) which may include a first capacitor that can be selectively switched into the LCO circuitry to control the sensor frequency. It should be noted that the first capacitor can be a discrete component. Alternatively, the first capacitor can be a capacitive element that provides a capacitance. The LCO circuitry may include the inductance sensor electrode (e.g., inductor) and capacitor that form the LC tank along with other components (e.g., capacitors or inductors) that may be selectively coupled to the LC tank in order to maintain a fixed sensor frequency. The LCO may further include a second capacitor that can be selectively switched into the LCO circuitry to control the sensor frequency. It should be noted that the second capacitor can be a capacitive element. Switching the first capacitor into the LCO circuitry may be to bring the sensor frequency closer (e.g., in range of) the reference frequency. Switching the second capacitor into the LCO circuitry may be to adjust the sensor frequency based on whether or not a sense detection is occurring (e.g., to make fine adjustments of the sensor frequency). The digital output of the LDC may be based on the number of times the second capacitor is switched in and out of the LCO circuitry.

In some embodiments, the inductance-sensing circuit can include an inductance sensor electrode (also referred to as a sensor electrode herein) that forms an oscillator in a digital control loop, where the control loop maintains a fixed frequency in the resonant circuit, which may be desirable to improve the EMC. In other words, the EMC of the system may be improved because the digital control loop matches the reference frequency (fref) and the sensor frequency (fsen). In some embodiments, the digital control loop output is proportional to the inductance change of an inductance sensor electrode (or an inductive element in a sensor). In some cases, the output of the digital control loop is not strictly proportional, as there can be a non-linear relation between the frequency of the signal of the inductance-sensing circuit and the frequency of the signal of the reference clock. In some embodiments, the output of the digital control loop can be considered to be dependent on the inductance change of the inductive sensor electrode. The inductive sensing architecture may be formed from an oscillator and a digital feedback loop that is easily scalable on any technology node. In addition to being easily scalable, the digital feedback loop is programmable in order to dynamically improve performance, with possible trade-offs in scan time, sensitivity, power, and resonant frequency. In some embodiments, the feedback loop may perform second-order noise shaping, which may improve sensitivity. Alternatively or additionally, the inductive sensing circuit may perform baseline compensation (e.g., it removes some of the base, or direct current (DC), signal before conversion to a digital signal, which reduces the dynamic range of the converter and thus may further improve sensitivity.

In some embodiments, the inductance-sensing circuitry described herein may provide additional benefits over other inductance-sensing circuitry. For the example, the inductance-sensing circuitry described herein may be a high dynamic range inductance-sensing circuitry, e.g., greater than 90 dB, and may operate over a wide possible range of sense frequencies (from kHz to MHz). In some embodiments, the inductance-sensing circuitry may operate at a fixed sense frequency which may improve EMC performance. Because the sense method relies on measuring inductance rather than impedance (e.g., resistance and reactance), the inductive sensing circuit may be less sensitive to thermal drift. Further, the inductance-sensing circuitry described herein does not require a reference sensor electrode, allowing for a smaller form factor. The digital control loop is easily scalable and can be self-calibrated.

FIG. 1 is block diagram of an inductance-sensing circuit 100 with a digital control loop to maintain a fixed frequency in a resonant circuit of the inductance-sensing circuit 100, according to one embodiment. The resonant circuit includes inductance sensor electrode 118 and capacitor 128. In one embodiment, inductance sensor electrode 118 and capacitor 128 of the resonant circuit may be in parallel. In another embodiment, inductance sensor electrode 118 and capacitor 128 of the resonant circuit may be in series. In some embodiments, the digital control loop may be a digital feedback loop. In some embodiments, inductance-sensing circuit 100 may use an analog control loop rather than a digital control loop. Inductance sensor electrode 118 (e.g., sensor coil or inductor coil) coupled to capacitor 128 forms a resonant circuit of the inductive sensing circuit. The digital control loop is configured to maintain a fixed frequency (or a constant frequency) in the resonant circuit by selectively coupling capacitors 106 and 108 into the resonant circuit via switching circuitry 126 and 114, respectively. An output of the digital control loop may be proportional or substantially proportional to the inductance change of inductance sensor electrode 118. In some embodiments, inductance sensor electrode 118 may be a sensor coil, an inductor, an inductive sensor, an inductive coil, an inductive element, or the like. In some embodiments, the resonant circuit may include inductance sensor electrode 118 and capacitor 128. In some embodiments, the resonant circuit may further include capacitors 106 and 108. Whether capacitors 106 and 108 are included in the resonant circuit may depend on the output of the digital control loop. In some embodiments, capacitors 106 and 108 may be capacitive elements.

In some embodiments, the inductance-sensing circuit 100 may include inductance sensor electrode 118, capacitor 128, and LDC 145 coupled to inductance sensor electrode 118 and capacitor 128. A first capacitor 108 is coupled to a first terminal 120. In some embodiments, the first capacitor 108 may be a dither capacitor. The first capacitor 108 is coupled to a first switching circuitry 114 (e.g., a switch), which may selectively couple the first capacitor 108 to the second terminal 122. Inductance-sensing circuit 100 further includes a current source 102. A cross-coupled differential transistor pair 104 is coupled to current source 102. A second capacitor 106 (e.g., a capacitor DAC) is coupled to the first terminal 120 and is further coupled to a second switching circuitry 126 (e.g., a switch). In some embodiments, the second capacitor 106 may be a capacitive element. The second switching circuitry 126 selectively couples the second capacitor 106 to the second terminal 122. Inductance sensor electrode 118, capacitors 128, 106, and 108, cross-coupled differential transistor pair 104, and current source 102 form an oscillator. In one embodiment, the oscillator may be an LC oscillator. In some embodiments, the oscillator may be a current-controlled oscillator or a voltage-controlled oscillator (VCO). In some embodiments, a capacitance of the second capacitor 106 may be variable. In some embodiments, the capacitance of the second capacitor 106 may be programmable. In some embodiments, the capacitance of the second capacitor 106 can be controlled with a digital value. Alternatively, the second capacitor may be implemented as multiple capacitors (e.g., two capacitors, three capacitors, or some number of capacitors) and switching circuitry 126 may selectively couple any combination of the multiple capacitors to the second terminal 122 in order to control the capacitance. Coarse adjust circuitry 124 is coupled to the switching circuitry 126. Coarse adjust circuitry 124 may receive a signal from proportional integral (PI) controller 112 to control switching circuitry 126 in order to selectively couple any combination of capacitors to the second terminal 122. In one embodiment, coarse adjust circuitry 124 can receive a digital value that controls (e.g., adjusts) an effective capacitance, represented as the second capacitor 106. In some embodiments, the capacitance can be controlled with a digital value from PI controller 112 or from another source. In one embodiment, the multiple capacitors with switching circuitry 126 and coarse adjust circuitry 124 form a variable capacitance circuit that is controlled digitally.

Inductance-sensing circuit 100 further includes a digital phase locked loop (PLL) coupled to the second terminal 122. The digital PLL includes phase frequency detector 110 and PI controller 112, and receives a first input signal 129 (e.g., F_sensor) indicating a sensor frequency (fsen) of the oscillator and a second input signal 130 (e.g., F_reference) indicating a reference frequency (fref) (e.g., of an internal reference clock). In some embodiments, input signal 129 (F_sensor or Fsen) may be to differential signals (Fsen− and Fsen+). The digital PLL outputs a digital bitstream as a control signal. In some embodiments, the digital bitstream may be a dither capacitor bitstream or a Cdither bitstream. Switching circuitry 114 receives the control signal to selectively couple the first capacitor 108 to the second terminal 122 to maintain the fixed frequency in the resonant circuit according to the digital bitstream. Digital filter 116 is configured to receive the digital bitstream as an input and is further configured to output the digital value. In some embodiments, digital filter 116 may be a $\text{sinc}^2$ filter. In some embodiments, digital filter 116 may be a brick wall filter, an ideal low-pass filter, or the like. In other embodiments, the digital filter may be a decimator. The digital PLL further includes phase frequency detector (PFD) 110 and PI controller 112. The PFD can be a linear PFD or a binary PFD. In some embodiments, phase frequency detector 110 may be a bang-bang PFD (BB-PFD).

Inductance-sensing circuit 100 includes an on-chip region and an off-chip region. The on-chip region is LDC 145 and includes current source 102, cross-coupled differential transistor pair 104, capacitors 106 and 108, switching circuitries 114 and 126, coarse adjust circuitry 124, PFD 110, proportional integral (PI) controller 112, and digital filter 116. The digital control loop includes PFD 110, PI controller 112, capacitor 108, and switching circuitry 114. The off-chip region includes capacitor 128 and inductance sensor electrode 118, which form the LC tank. The resonant circuit may be formed by the LC tank and capacitors 106 and 108, which may be selectively coupled to the LC tank. In other embodiments, any of capacitor 128, inductance sensor electrode 118, capacitor 106, capacitor 108, and other components can be off-chip. In still other embodiments, capacitor 128 and inductance sensor electrode 118 may be on-chip.

Inductance-sensing circuit 100 may be used for proximity detection for human interface on a wide variety of materials including both ferrous and non-ferrous metals. Inductance sensor electrode 118 is an inductive coil or an inductive sensor element that can be formed using copper trace on a printed circuit board (PCB), in one embodiment. In other embodiments, the inductance sensor electrode may be a planar inductor, planar spiral coil, a wire-wound inductor, a wire-wound coil, a compressed spring inductor, or the like. Inductance sensor electrode 118 (e.g., the inductor) coupled in parallel to capacitor 128 forms an LC tank. The LC tank can be driven at a resonance frequency (e.g., the resonance frequency of an LC circuit). The signal from the LC tank is then used as an input for phase detector 110 (e.g., BB-PFD) and PI controller 112 and is digitized by digital filter 116. A metal object, when placed in proximity to the inductance sensor electrode 118 changes the amplitude of oscillation and the frequency (e.g., the resonant frequency) of oscillation of the LC tank. In an inductance method, the change in the resonant frequency is measured. In operation, a button may be formed with a metal object, and when pressed (e.g., deflected), the resonant frequency of the LC tank is changed and can be sensed (e.g., measured).

In the depicted embodiment, inductance-sensing circuit 100 includes an oscillator (e.g., oscillator front end) which includes current source 102 coupled to cross coupled differential transistor pair 104, capacitor 106 (e.g, the capacitor DAC), capacitor 108 (e.g., the dither capacitor), capacitor 128, and inductance sensor electrode 118. In one embodiment, the oscillator may be an LC oscillator. In some embodiments, the oscillator may be a current-controlled oscillator or a VCO. Cross-coupled differential transistor pair 104 can act as a negative feedback loop and can provide negative resistance. Phase detector 110 (e.g., the BB-PFD) is coupled to PI controller 112 to control dither capacitor 108. Digital filter 116 filters the output of PI controller 112 and outputs a digital raw count value (e.g., depicted as <0:15> in FIG. 1). Inductance sensing electrode 118 is placed across the terminals (e.g., between a first terminal and a second terminal). The LC tank oscillates at the resonant frequency (e.g., the sensor frequency, or fsen). Capacitor 106 brings the sensor frequency closer to the reference frequency (e.g., fref), which allows dither capacitor 108 to be selectively coupled via switch 114 to adjust the sensor frequency (fsen).

The digital control loop is formed by phase detector 110 (e.g., the BB-PFD), PI controller 112, and dither capacitor 108. The feedback loop compares the resonant circuit frequency of operation (e.g., the sensor frequency, or fsen) to a reference clock source (e.g., the reference frequency, or fref). The digital feedback loop maintains the sensor frequency of operation the same as the reference frequency (which may be set to be the resonance frequency of the LC tank) by switching dither capacitor 108 in and out of the loop via switch 114. The sensor frequency depends, in a first order approximation, on the capacitances of capacitors 106 and 108 as follows:

$$fsen = \frac{1}{2\pi\sqrt{L(\text{Ctrim\_dac} + Cdither)}}.$$

When a target (e.g., an object that causes a change in inductance of the inductance sensor electrode when proximate to the inductance sensor electrode) approaches inductance sensor electrode 118, a change in the inductance L of inductance sensing electrode 118 is induced, which causes a shift (e.g., a change) in the sensor frequency. The digital feedback loop is configured to compensate for the change in inductance (and therefore the change in resonant frequency) by controlling a duty cycle of dither capacitor 108 (e.g., by changing how often switch 114 switches on and off, or how often the dither capacitor is switched in and out of the digital feedback loop), causing the sensor frequency to be equal to the reference frequency. PI controller 112 then outputs a digital value representing the frequency that dither capacitor 108 is switched. The output of PI controller 112 is filtered by digital filter 116 to get the final digital raw count value.

In another embodiment, the PLL may be an analog PLL. In other embodiments, the PLL may be any circuitry to compare the sensor frequency of the sensor signal to the reference frequency of the reference signal in order to control switch 114 to selectively couple capacitor 108 to the second terminal 122 in order to maintain the sensor frequency to be the same as the reference frequency.

Figure 2A:
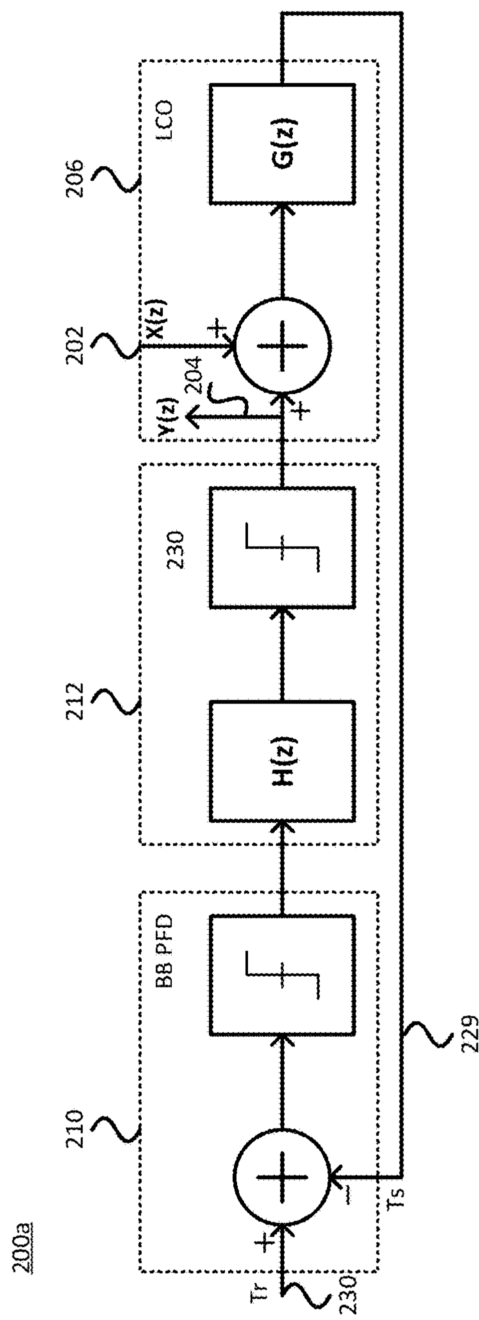
FIG. 2A is a schematic diagram representing a system transfer function of an inductive sensing circuit with a digital PLL, according to one embodiment.

FIG. 2A is a schematic diagram 200*a* representing a system transfer function of an inductive sensing circuit with a digital PLL, according to one embodiment. In some embodiments, 200*a* may represent a model of the system. Input 202 (e.g., X(z)) represents a displacement input from the inductance sensor electrode that modulates the oscillator 206 (e.g., LCO in FIG. 2). An output 204 is represented by Y(z). In some embodiments the variable z may represent time. In some embodiments, the variable z may represent a discrete time. Tr 214 and Ts 216 represent the period of the reference clock and the oscillator clock (e.g., the LCO clock or the sensor signal), respectively.

Phase detector 210 (e.g., BB-PFD) receives a sensor signal 229 indicating the sensor period (Ts) (or equivalently, the sensor frequency) and a reference signal 230 indicating the reference period (Tr) (or equivalently, the reference frequency). The phase detector compares the sensor frequency with the reference frequency and outputs a result of the comparison to PI controller 212. PI controller 212 outputs a control signal to LCO 206 in order to control a switching of switch 114 (in reference to FIG. 1) in order to cause the sensor frequency to match the reference frequency.

Figure 2B:
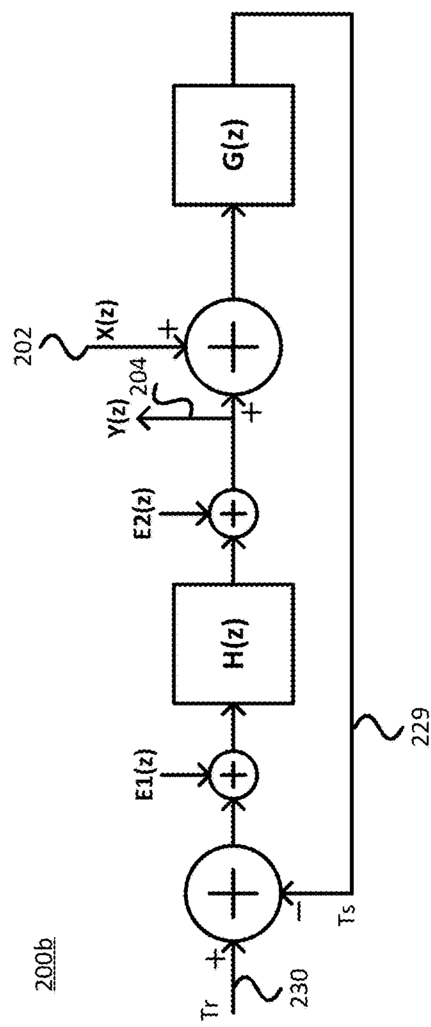
FIG. 2B is a schematic diagram representing a system transfer function of an inductive sensing circuit, according to one embodiment.

FIG. 2B is a schematic diagram 200*b* representing a system transfer function of an inductive sensing circuit, according to one embodiment. FIG. 2B models noise shaping of the system. Quantization noise from PI controller is second-order shaped by the loop (e.g., phase detector 210, PI controller 212, and LCO 206). The output of the PI controller can be expressed:

$$Y(z) = \frac{E2(z)}{[1 + H(z)G(z)]}.$$

Noise from the reference clock (e.g., the reference signal with the reference period Tr) is first-order shaped by the PLL. The first order characteristic should dominate a noise transfer function. This is represented below:

$$Y(z) = \frac{[E1(z) + Tr(z)]H(z)}{[1 + H(z)G(z)]}.$$

The signal transfer function is:

$$Y(z) = \frac{X(z)H(z)G(z)}{[1 + H(z)G(z)} \approx X(z).$$

The overall system transfer function is then:

$$Y(z) = \frac{E2(z)}{[1 + H(z)G(z)]} + \frac{[E1(z) + Tr(z)]H(z)}{[1 + H(z)G(z)]} + \frac{X(z)H(z)G(z)}{[1 + H(z)G(z)}.$$

Figure 3B:
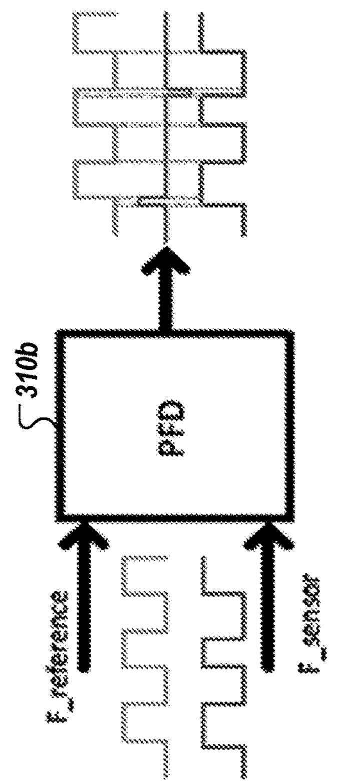
FIG. 3B is a schematic diagram illustrating the operation of an analog PFD, according to one embodiment.
Figure 3A:
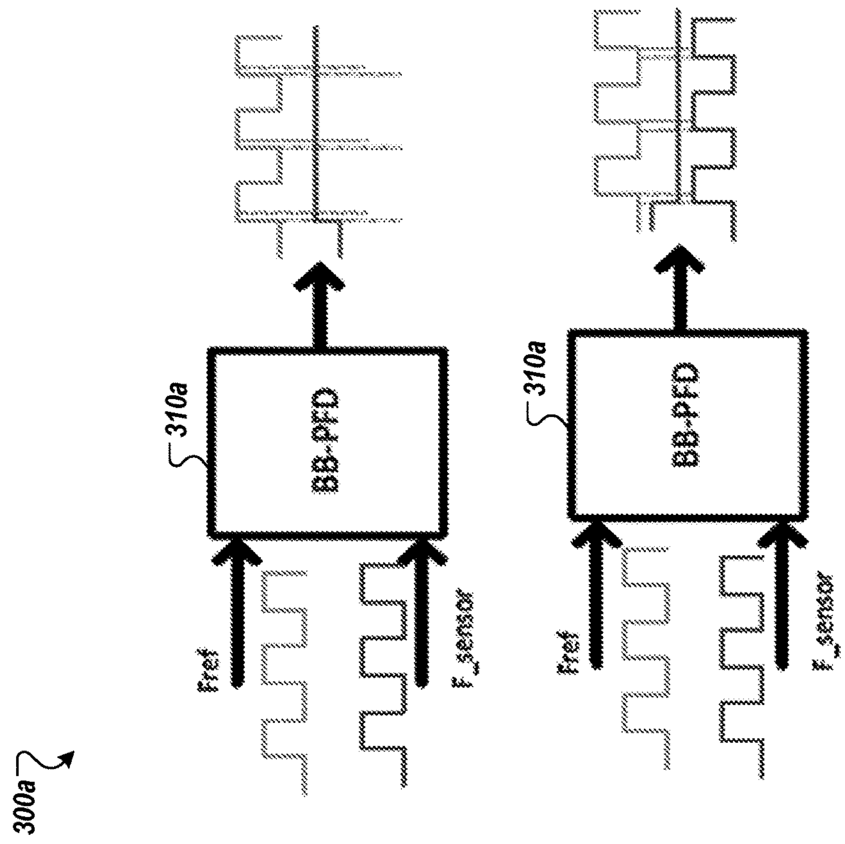
FIG. 3A is a schematic diagram illustrating the operation of a digital phase-frequency detector (PFD), according to one embodiment.

FIG. 3A is a schematic diagram 300*a* illustrating the operation of a digital PFD, according to one embodiment. Referring back to FIG. 1, the PFD is coupled to terminal 122. In some embodiments, the PFD may be a digital PFD. In other embodiments, the PFD may be one of a linear phase detector or a binary phase detector. In the depicted embodiment, the PFD 310*a* is a BB-PFD (e.g., a binary phase detector). BB-PFD 310*a* is configured to take two signals as inputs (e.g., a first signal with a reference frequency and a second signal with a sensor frequency) and determine whether the first signal is leading or lagging with the respect to the second signal. BB-PFD 310*a* is further configured to output an output signal. In some embodiments, the output signal may be high when the reference signal leads the sensor signal, and may be low when the reference signal lags behind the sensor signal. In other embodiments, the output signal may be low when the reference signal leads the sensor signal, and may be high when the reference signal lags behind the sensor signal. To determine whether the first signal is lagging or leading the second signal, BB-PFD 310*a* includes a comparator as described in more detail with respect to FIGS. 4A and 4B.

FIG. 3B is a schematic diagram 300*b* illustrating the operation of an analog PFD, according to one embodiment. Referring back to FIG. 1, PFD 310*b* may be BB-PFD 110 and is coupled to terminal 122. In other embodiments, PFD 310*b* may be one of a linear phase detector or a binary phase detector. In the depicted embodiment, PFD 310*b* is configured to take two signals as inputs (e.g., a first signal with a reference frequency and a second signal with a sensor frequency) and determine whether the first signal is leading or lagging with the respect to the second signal. PFD 310*b* is further configured to output an output signal. In some embodiments, the output signal may be high when the reference signal leads the sensor signal, and may be low when the reference signal lags behind the sensor signal. In other embodiments, the output signal may be low when the reference signal leads the sensor signal, and may be high when the reference signal lags behind the sensor signal. In some embodiments, the reference signal may lead the sensor signal at some times and may lag behind the sensor signals at other times. To determine whether the first signal is lagging or leading the second signal, PFD 310*b* includes a comparator as described in more detail with respect to FIGS. 4A and 4B as well as FIGS. 5A and 5B.

Figure 4B:
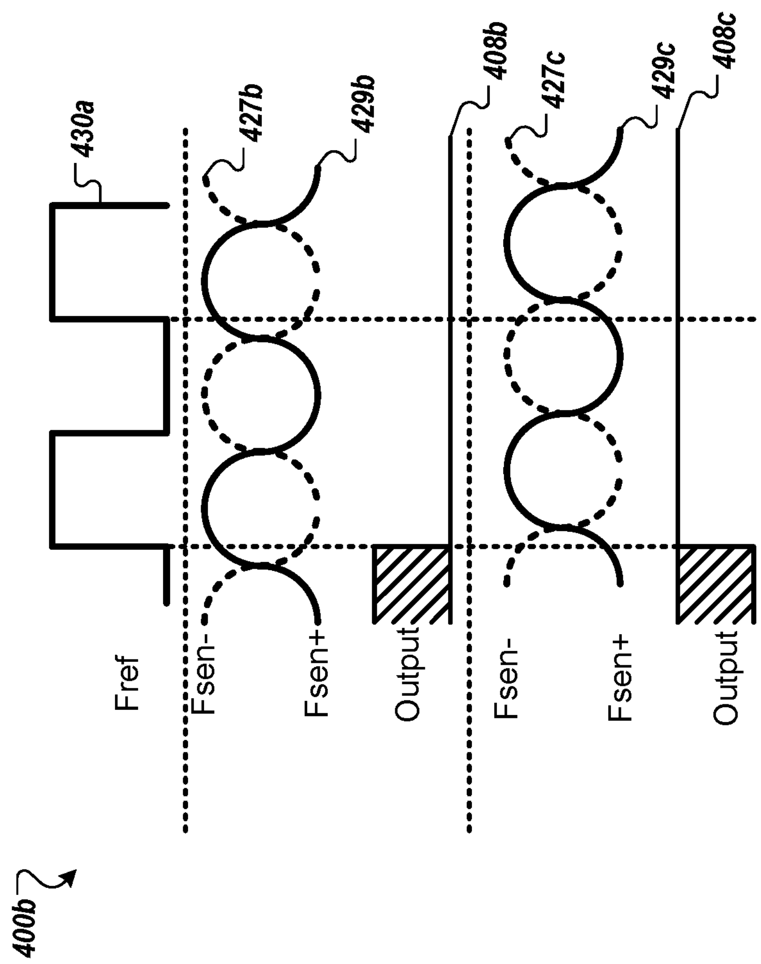
FIG. 4B is a waveform diagram illustrating a reference clock signal, differential input signals, and output signals of the clocked comparator, according to one embodiment.
Figure 4A:
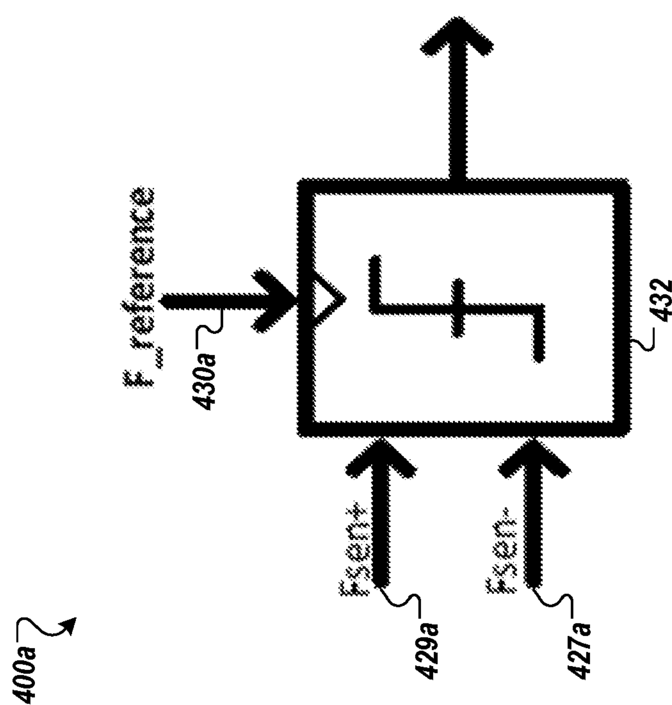
FIG. 4A is a schematic diagram illustrating a clocked comparator implementation of a bang-bang phase-frequency detector (BB-PFD), according to one embodiment.

FIG. 4A is a schematic diagram 400*a* illustrating a clocked comparator implementation of a BB-PFD, according to one embodiment. The BB-PFD can include a comparator 432 (e.g., a clocked comparator). Referring back to FIG. 1, the comparator differential inputs are the outputs of the resonant circuit (e.g., inductance sensor electrode 118 and capacitor 128 along with capacitors 106 and 108). A first input (e.g., a negative input) of the comparator is coupled to terminal 120 and receives a first differential input signal 427*a* (e.g., Fsen-) and a second input (e.g., a positive input) is coupled to the terminal 122 and receives a second differential input signal 429*a* (e.g., Fsen+). Referring back to FIG. 1, the first differential input signal 427*a* (Fsen-) and the second differential input signal 239*a* (Fsen+) are represented as signal 129 (F_sensor or Fsen) indicative of a frequency of the sensor signal. The reference clock provides a second input signal 430*a* (e.g., a reference clock signal, F_reference), indicative of a frequency of the reference signal, for the comparator to compare differential inputs 427*a* and 429*a* (Fsen– and Fsen+). A clock input is configured to receive the second signal (e.g., the second input signal) to clock comparisons of the differential inputs.

FIG. 4B is a waveform diagram 400*b* illustrating a reference clock signal, differential input signals, and output signals of the clocked comparator, according to one embodiment. FIG. 4B illustrates two cases, the first one in which the sensor signal (Fsen– 427*b* and Fsen+ 429*b*) lags behind the reference signal (Fref 430*a*) and outputs a low signal 408*b*, and the second one in which the sensor signal (Fsen– 429*c* and Fsen+ 429*c*) lead before the reference signal (Fref 430*a*) and outputs a high signal 408*c*. The comparator of the BB-PFD receives a second signal 430*a* (Fref) as an input. In some embodiments, the second signal is a reference clock (e.g., an internal clock) signal with associated with a reference frequency (fref). Referring back to FIG. 1, in one embodiment, the comparator of the BB-PFD receives a first signal including a first differential signal 427*b* from the first terminal 120 and a second differential signal 429*b* from the second terminal 122. The first differential signal 427*b* may be a negative differential signal (Fsen–). The second differential signal 429*b* may be a positive differential signal (Fsen+). In one embodiment, the comparator 432 compares the first signal 427*b* and 429*b* with the second signal 430*a* and determines that the first signal (e.g., Fsen- and Fsen+) lags behind the second signal (e.g., Fref). The comparator may then output a low signal 408*b*. A low signal may correspond to a signal at a first voltage, or at a zero voltage. In another embodiment, the comparator 432 compares the first signal 427*c* and 429*c* with the second signal 430*a* and determines that the first signal (e.g., Fsen– and Fsen+) leads the second signal (e.g., Fref). The comparator 432 may then output a high signal 408*c*. A high signal may correspond to a signal at a second voltage that is greater than the first voltage or a zero voltage. In other embodiments, the comparator may output a low signal when the first signal leads the second signal and a high signal when the first signal lags behind the second signal.

Figure 5A:
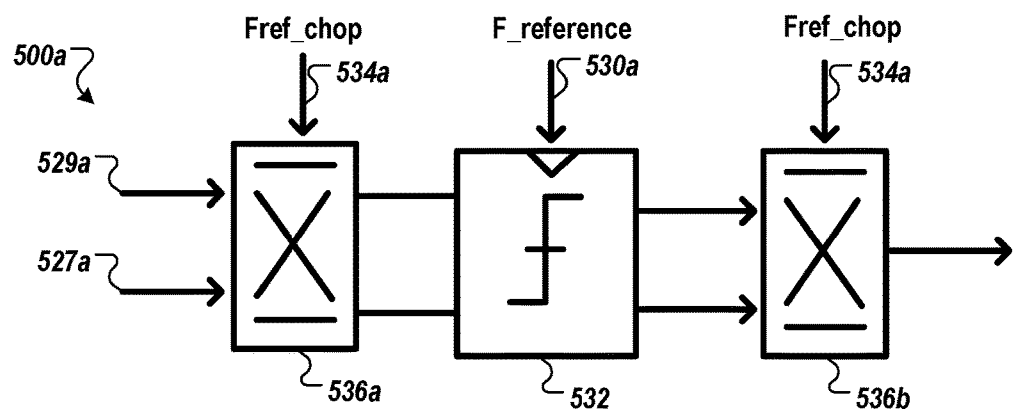
FIG. 5A is a schematic diagram illustrating a chopped comparator implementation of a BB-PFD, according to one embodiment.

FIG. 5A is a schematic diagram 500*a* illustrating a chopped comparator implementation of a BB-PFD, according to one embodiment. The BB-PFD can include a comparator 532 with differential inputs and differential outputs. In the depicted embodiment, and referring back to FIG. 1, a first chop circuit 536*a* is coupled to the first terminal 120 and is coupled to the second terminal 122. The first chop circuit 536*a* is further coupled to the differential inputs 527*a* and 529*a*. The BB-PFD further includes a second chop circuit 536*b* coupled to the differential outputs of the comparator 532. The first chop circuit 536*a* and the second chop circuit 536*b* are clocked by signal 534*a*. Signal 534*a* (Fref_chop) may be a rate (e.g., a frequency) that is a fraction of the reference frequency (fref) of the reference signal 530*a* (F_reference). In some embodiments, the rate may be fref/128, fref/2, or another rate that is slower than the reference frequency (fref). A rate may be a fraction of a frequency. Additionally or alternatively, a frequency may be a fraction of a rate. By chopping the differential inputs by the first chop circuit 536*a* and the differential outputs of the comparator by the second chop circuit 536*b*, the 1/f noise (e.g., low frequency noise, flicker noise, or pink noise) of the comparator may be mitigated.

Figure 5B:
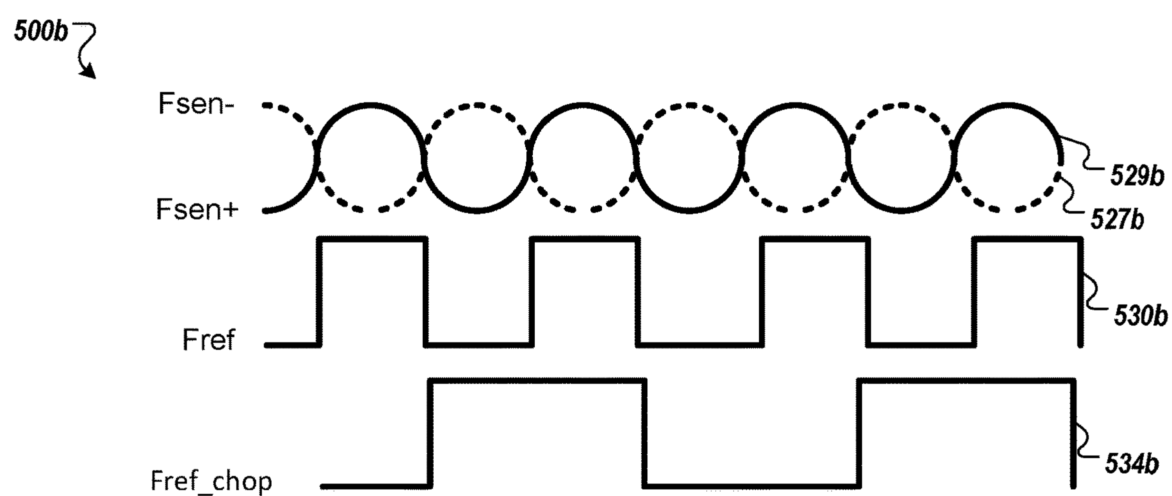
FIG. 5B is a waveform diagram illustrating a reference clock signal (Fref), differential input signals and (Fsen− and Fsen+, respectively), and a chop signal (Fref_chop), according to one embodiment.

FIG. 5B is a waveform diagram 500*b* illustrating a reference clock signal 506*b* (Fref), differential input signals 527*b* and 529*b* (Fsen- and Fsen+, respectively), and a chop signal 534*b* (Fref_chop), according to one embodiment. The first chop circuit 536*a* receives a first signal from the resonant circuit. Referring to FIG. 1, the first signal includes a first differential input 527*b* from the first terminal 120 and a second differential input 529*b* from the second terminal 122. In one embodiment, the first differential input 527*b* is Fsen- and the second differential input 529*b* is Fsen+. In another embodiment, the first differential input 527*b* is Fsen+ and the second differential input 529*b* is Fsen-. The first chop circuit chops the differential input signals 527*b* and 529*b* at with a signal 534*b* (Fref_chop) at a rate (e.g., frequency) of a fraction of the reference frequency 530*b* (Fref), so that the rate (e.g., frequency) of the signal 534*b* (Fref_chop) is less than a frequency of the reference signal 530*b*. A differential output of the first chop circuit 536*a* is a differential input of the comparator 532. The differential output of the comparator 532 is then chopped by the second chop circuit 536*b*. Referring back to FIG. 1, the output of the second chop circuit 536*b* is then the input of the PI controller 112.

Figure 6A:
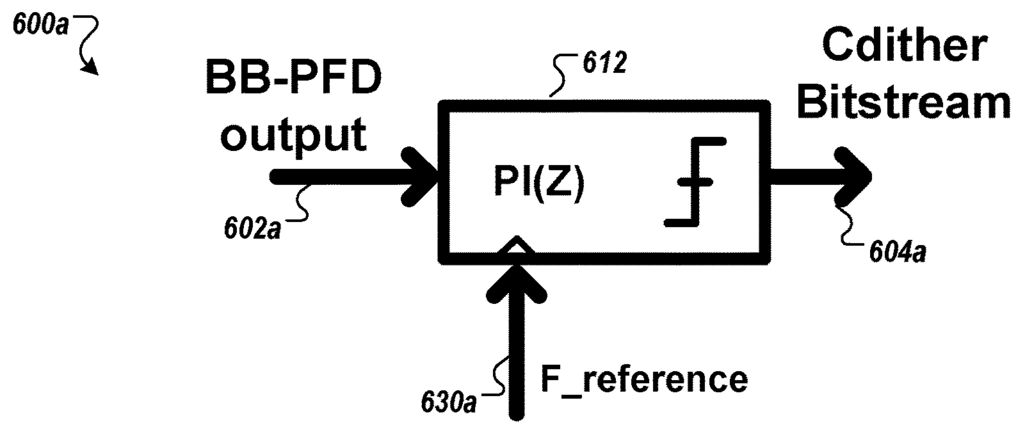
FIG. 6A is a schematic diagram illustrating a proportional integral (PI) controller, according to one embodiment.

FIG. 6A is a schematic diagram illustrating a PI controller 600*a*, according to one embodiment. Referring back to FIG. 1, PI controller 612 (or PI controller 112) is coupled to an output of BB-PFD 110 and receives a first signal 602*a* (BB-PFD output) as an input from BB-PFD 110. PI controller 612 receives a second signal 630*a* (F_reference) with a reference frequency (fref). PI controller 612 outputs a control signal 604*a* based on the output signal 602*a* of the BB-PFD. The control signal 604*a* may be to switch switching circuitry 114 in order to selectively couple capacitor 108 to the second terminal 122. In some embodiments, PI controller 612 may be a digital PI controller.

Figure 6B:
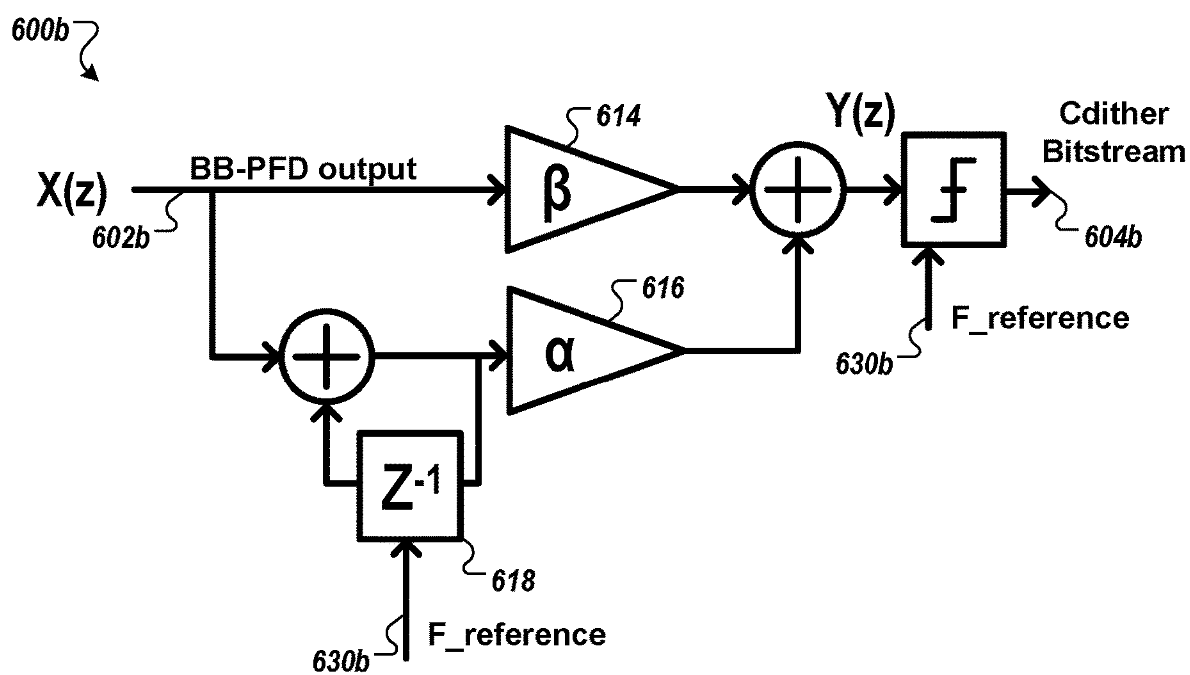
FIG. 6B is a schematic diagram of a PI controller, according to one embodiment.

FIG. 6B is a schematic diagram 600*b* of a PI controller, according to one embodiment. The PI controller may be clocked by reference signal 630*b* (F_reference). A transfer function describing the operation of the PI controller can be described as:

$$Y(z)=\beta X(z)+\alpha[X(z)+X(z-1)].$$

where $\beta$ is a first gain factor 614 (or a first multiplier) and $\alpha$ is a second gain factor 616 (or a second multiplier). PI controller 600*a* takes a first signal 602*b* as an input, which may be fed through gain factor 614. PI controller 600*a* further takes a second signal 630*b* which is added to the first signal 602*b*, which may be fed through gain factor 616 or may be looped through an integrator 618. The outputs from gain factor 614 and gain factor 616 may then be summed (e.g., added) and compared to reference signal 630*b* (Fref) in order to generate output 604*b* (e.g., Cdither Bitstream).

Referring back to FIG. 1, in one embodiment, a digital feedback loop may be formed by BB-PFD 110, PI controller 112, the capacitor 108. An output of the digital feedback loop is input into digital filter 116. The output may represent how often capacitor 108 (e.g., the dither capacitor) is switched. In one embodiment, capacitor 108 may be a single bit capacitor. In that case, the sign or most significant bit (MSB) of the PI controller output controls whether capacitor 108 is switched in or out. In another embodiment, capacitor 108 may be a multi-bit capacitor. In that case, then the MSBs of the PI controller output can be used to control the capacitance of the one or more the capacitors (e.g., capacitor 108).

Digital filter 116 can be any digital filter. In one embodiment, digital filter 116 is a $\text{sinc}^2$ filter. In some embodiments, digital filter 116 may be a brick wall filter, an ideal low-pass filter, or the like. In other embodiments, the digital filter may be a decimator. Digital filter 116 is configured to take a high frequency bitstream of capacitor 108 (e.g., a dither capacitor or a capacitive element) and filter the high frequency bitstream to provide an output response (e.g., digital raw count <0:15>). In some embodiments, the frequency of the bitstream is less than 10 kHz, allowing for the use of a digital filter with similar bandwidth. Alternatively, or additionally, a filter with a lower cut-off frequency may be used to further reduce noise.

Figure 7:
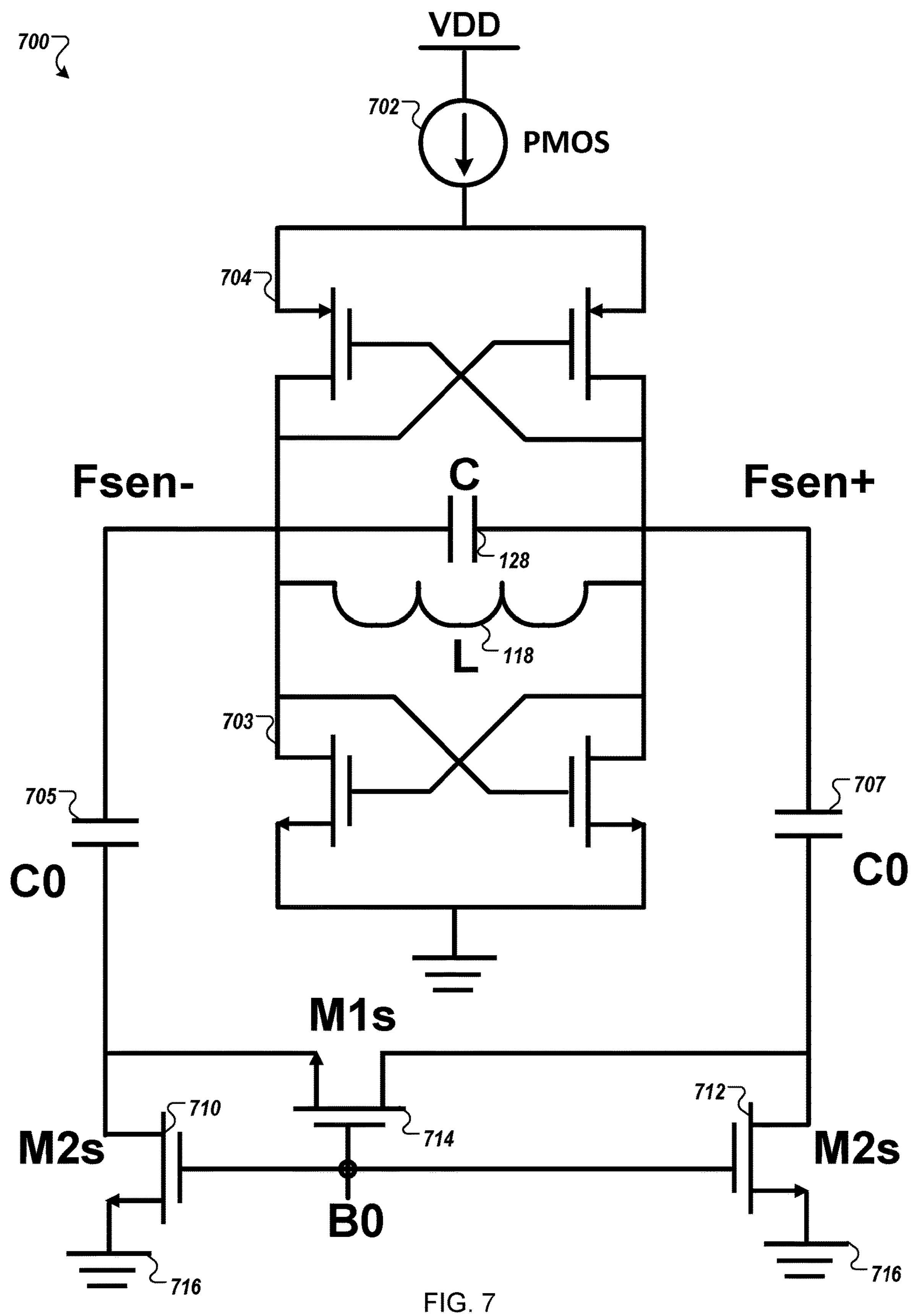
FIG. 7 is a block diagram of an inductor-capacitor oscillator (LCO) of an inductive sensing circuit, according to one embodiment.

FIG. 7 is a block diagram of an LCO 700 of an inductive sensing circuit, according to one embodiment. Although not all components of the LCO are shown, LCO 700 is similar to the LCO of inductance-sensing circuit 100 of FIG. 1, as noted by similar reference numbers. FIG. 7 illustrates a switching mechanism for switching a capacitor DAC in and out of the LCO circuit. The LCO includes a current source 702 coupled to a first cross-coupled differential transistor pair 704. An inductance sensor electrode (e.g., inductance sensor electrode 118) and a capacitor 128 are coupled between the first cross-coupled differential transistor pair 704 and a second cross-coupled differential transistor pair 703. A first capacitor 705 is coupled to a first terminal (e.g., terminal 120, in reference to FIG. 1 and not shown in FIG. 7) and a second capacitor 707 is coupled to a second terminal (e.g., terminal 122, in reference to FIG. 1 and not shown in FIG. 7). A switching circuitry including a first switch 710, a second switch 712, and a third switch 714 is coupled to the first capacitor 705 and the second capacitor 707. The switching circuitry may be the switch 126 of FIG. 1. The first switch 710 is coupled between the first capacitor 705 and a ground potential 716. The second switch 712 is coupled between the second capacitor 707 and the ground potential 716. The third switch 714 is coupled between the first capacitor 705 and the second capacitor 707. The first capacitor 705 and the second capacitor 707 effectively represent the capacitor DAC (e.g., capacitor 106 in reference to FIG. 1).

When the third switch 714 is open and the first switch 710 and the second switch 712 are closed, the first capacitor 705 is coupled to the second capacitor 707 as a parallel capacitor (e.g., the first capacitor 705 and the second capacitor 707 are coupled in parallel) coupled across the first terminal and the second terminal. In effect, this may be the same as closing the switch 126 in FIG. 1. When the third switch 714 is closed and the first switch 710 and the second switch 712 are open, the first capacitor 705 and the second capacitor 707 are floating and do not load the LCO (e.g., the LC tank). Effectively, the first capacitor 705 and the second capacitor 707 are de-coupled from acting as the parallel capacitor across the first terminal and the second terminal.

In some embodiments, a first capacitance of this first capacitor 705 and a second capacitance of the second capacitor 707 may be controlled with a digital value. In some embodiments, the LCO 700 may include the first capacitor 705, the second capacitor 707, a third capacitor, a fourth capacitor, or some number of capacitors that can be switched by the switching circuitry in order to control an effective capacitance of the parallel capacitor. In some embodiments and referring back to FIG. 1, the capacitor 108 (e.g., the dither capacitor) can be switched using the same switching circuitry as for the first capacitor 705 and the second capacitor 707. A coarse adjust circuitry 124 is coupled to the switching circuitry 126. The coarse adjust circuitry 124 switches capacitor 106 via switching circuitry 126 in and out of the LCO circuit in order to bring the sensor frequency (fsen) closer to the reference frequency (fref).

Figure 8B:
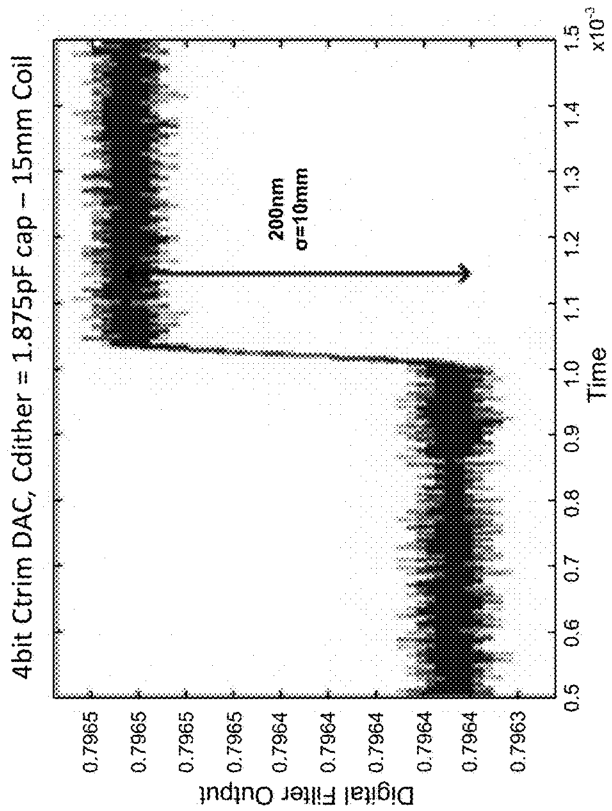
FIG. 8B is a graph showing a digital filter output signal and standard deviation of quantization noise of an inductance sensor circuit according to one embodiment.
Figure 8A:
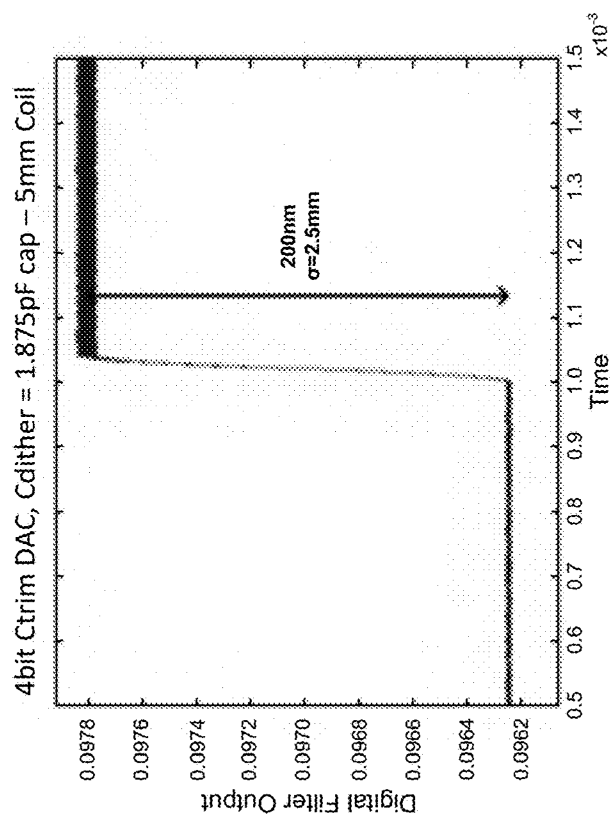
FIG. 8A is a graph showing a digital filter output signal and standard deviation of quantization noise of an inductance sensor circuit according to one embodiment.

FIG. 8A is a graph showing a digital filter output signal and standard deviation of quantization noise of an inductance sensor circuit according to one embodiment. The inductance sensor circuit includes an inductor with a 5 mm diameter coil and 200 nm of metal deflection. In the following description of FIGS. 8A and 8B, various components are described in reference to FIG. 1. In the depicted embodiment, the inductive sensing circuit includes an inductance sensor electrode 118 (e.g., an inductor) with a diameter of 5 millimeters (mm), a capacitor DAC with 4 bits (e.g., capacitor 106), and a dither capacitor (e.g., capacitor 108) of 1.875 pico-Farads (pF). The standard deviation of the quantization noise is 2.5 nanometers-root mean square (nm-rms).

FIG. 8B is a graph showing a digital filter output signal and standard deviation of quantization noise of an inductance sensor circuit according to one embodiment. The inductance sensor circuit includes an inductor with a 15 mm diameter coil and 200 nm of metal deflection. In the depicted embodiment, the inductive sensing circuit includes an inductance sensor electrode 118 (e.g., an inductor) with a diameter of 15 mm, a capacitor DAC with 4 bits (e.g., capacitor 106), and a dither capacitor (e.g., capacitor 108) of 1.875 pF. The standard deviation of the quantization noise is 10 nm-rms. The difference in the results between the 5 mm coil and the 15 mm coil may be due to larger inductance of the 15 mm coil. In order to achieve the same resonant frequency, the total capacitance used for the 15 mm coil (e.g., Ctrimdac+Cdither) should be smaller.

The dither capacitor (e.g., capacitor 108) represents a larger percentage of the total capacitance (e.g., Ctrimdac+Cdither) for the case of the 15 mm coil and may therefor cause a larger amount of quantization noise. A noise floor of the quantization noise may be reduced by using a dither capacitor with a smaller capacitance or with multiple bits, possibly reducing the noise floor to the levels of (or lower than) the case for the 5 mm coil.

Figure 9A:
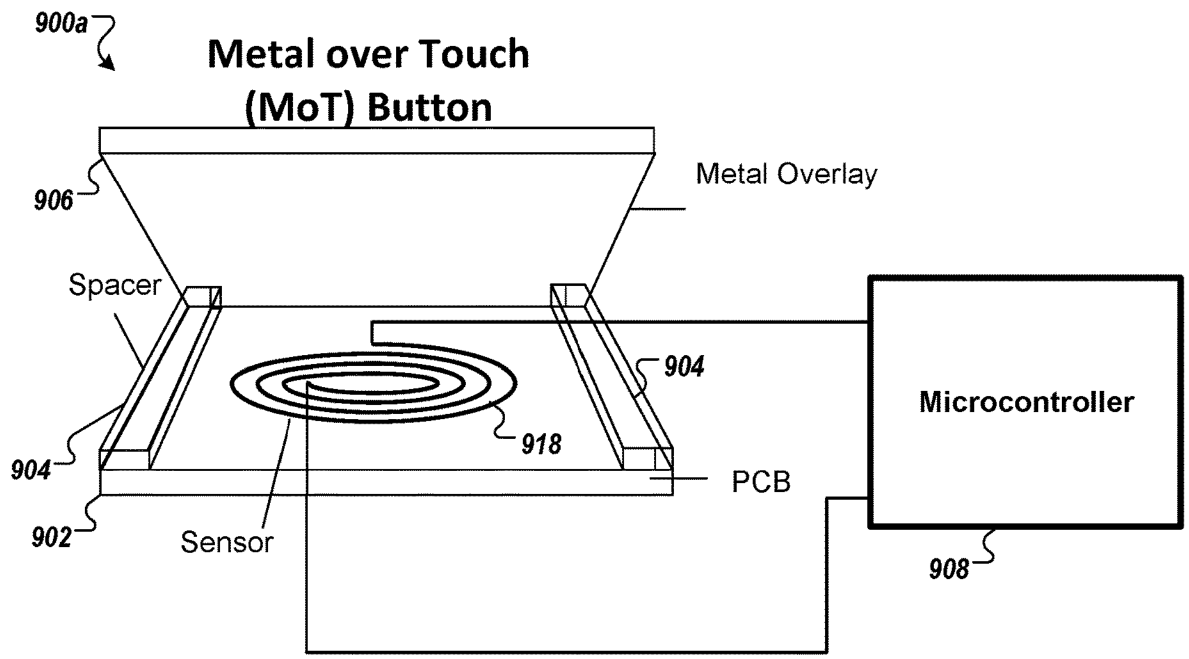
FIGS. 9A-9B depict a metal over touch (MoT) button using an inductive sensor electrode with a metal overlay, according to one embodiment.
Figure 9B:
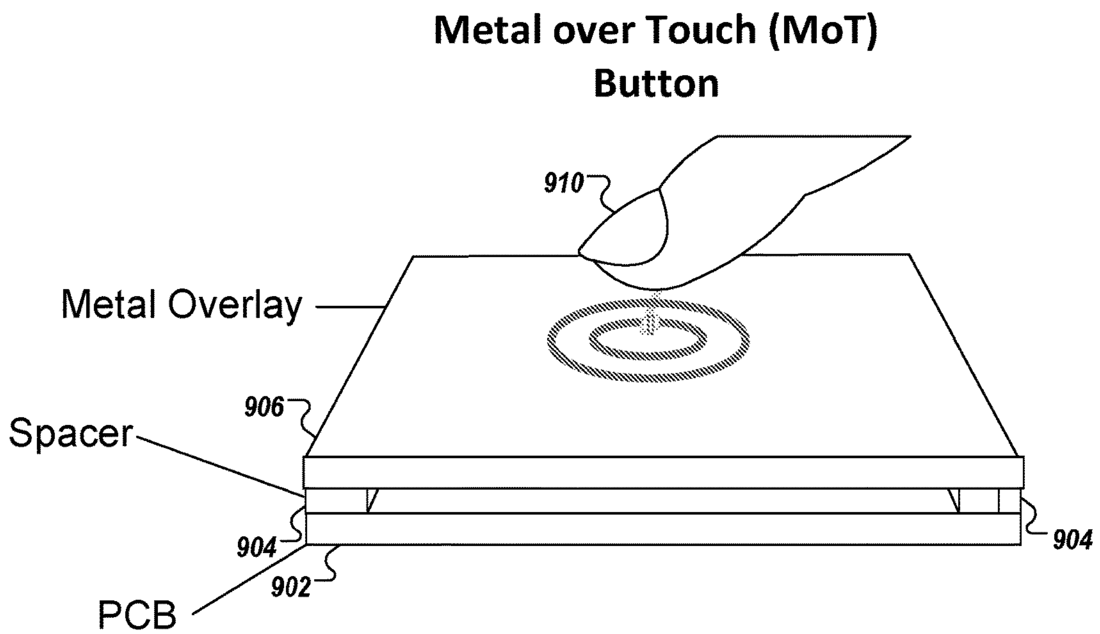

FIGS. 9A-9B depict a metal over touch (MoT) button 900*a* using an inductive sensor electrode with a metal overlay, according to one embodiment. One application for the inductive sensing circuit described in the present disclosure is for high-sensitivity MoT buttons for a human machine interface (HMI). MoT button 900*a* may include a PCB 902*a* on top of which is disposed an inductive sensing electrode 918 (e.g., a sensor coil, an inductor, an inductor coil, an inductive element, or the like). The inductive sensing electrode may be the inductance sensor electrode 118 in FIG. 1. A metal overlay 906*a* may be disposed above PCB 902*a* and inductive sensing electrode 918. Spacers 904*a* may be disposed between metal overlay 906*a* and PCB 902*a* to prevent metal overlay 906*a* from directly contacting inductive sensing electrode 918. The remaining components of the inductance-sensing circuit described in FIG. 1 may be part of a microcontroller 908 (e.g., the Programmable System on a Chip (PSOC®) device developed by Cypress Semiconductor Corporation (San Jose, California)), and are not shown in FIGS. 9A-9B.

A force (e.g., an applied force by a finger or other object) applied to metal overlay 906*a* causes the metal to deflect. The deflection can be detected by inductive sensor electrode 918. In some embodiments, deflections of less than 200 nm may be detected by the inductance-sensing circuit described in the present disclosure.

Figure 10A:
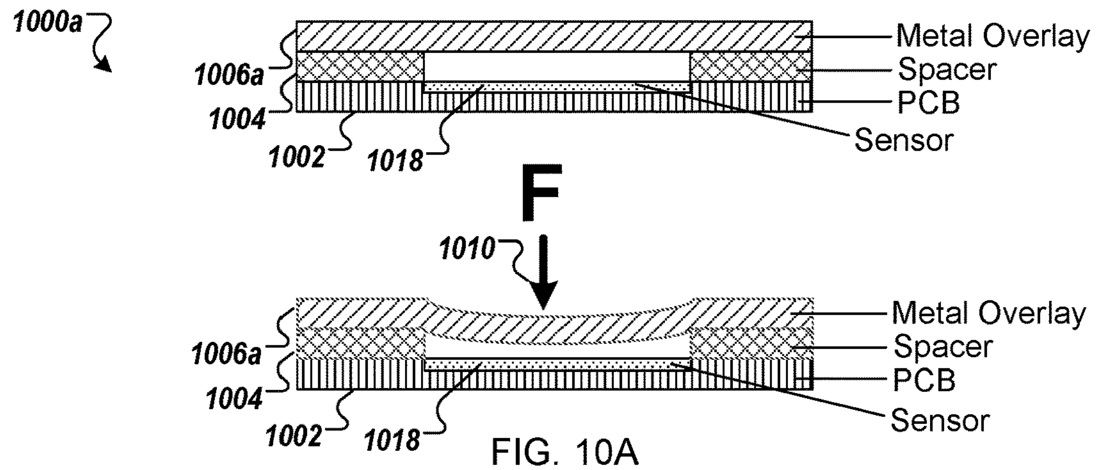
FIGS. 10A-10C illustrate cross-sectional views for three cases of MoT buttons according to various embodiments.
Figure 10B:
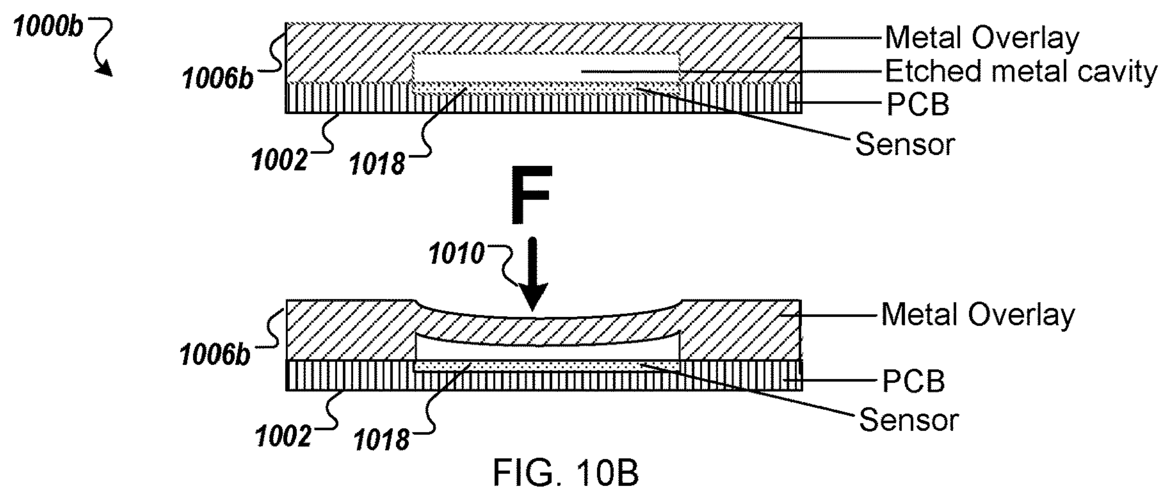
Figure 10C:
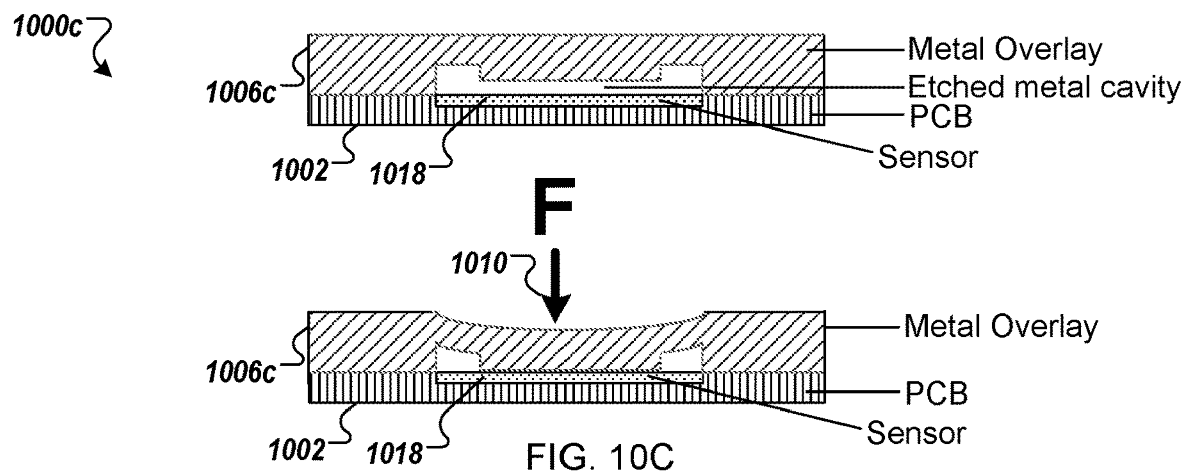

FIGS. 10A-10C illustrate cross-sectional views for three cases of MoT buttons according to various embodiments. FIG. 10A is a schematic illustration of a cross-sectional view of an MoT button 1000*a* with a metal overlay and a spacer, with and without an applied force 1010. MoT button 1000*a* may include a PCB 1002 on top of which is disposed an inductance sensor electrode 1018 (e.g., a sensor coil, an inductor, an inductor coil, an inductive element, or the like). The inductance sensor electrode may be inductance sensor electrode 118 in FIG. 1. A metal overlay 1006*a* may be disposed above PCB 1002 and the inductance sensor electrode 1018. Spacers 1004 may be disposed between metal overlay 1006*a* and PCB 1002 to prevent metal overlay 1006*a* from directly contacting inductance sensor electrode 1018. The remaining components (e.g., the LDC) described in FIG. 1 are not shown in FIGS. 10A-C. When a force 1010 (e.g., F) is applied to metal overlay 1006*a*, it causes metal overlay 1006*a* to deflect (e.g., to move closer to inductance sensor electrode 1018). Force 1010 may be caused by a finger (or another suitable object) pressing on metal overlay 1006*a*, or by any applied force, contact force, or the like. In some embodiments, force 1010 may cause a deflection of metal overlay 1006*a* by less than 200 nm. The deflection may cause the resonant frequency of the resonant circuit to be shifted. The deflection may be detected by inductance sensor electrode 1018.

FIG. 10B is a schematic illustration of a cross-sectional view of an MoT button 1000*b* with an etched metal overlay 1006*b*, with and without an applied force 1010, according to one embodiment. MoT button 1000*b* may include a PCB 1002 on top of which is disposed an inductance sensor electrode 1018 (e.g., a sensor coil, an inductor, an inductor coil, an inductive element, or the like). The inductance sensor electrode may be inductance sensor electrode 118 in FIG. 1. A metal overlay 1006*b* may be disposed above PCB 1002 and inductance sensor electrode 1018. In the depicted embodiment, metal overlay 1006*b* is disposed directly on top of PCB 1002. A cavity is etched in metal overlay 1006*b* so that metal overlay 1006*b* does not directly contact inductance sensor electrode 1018. A cross section of the cavity may be rectangular, square, semi-elliptical, or the like. The operation of the MoT button 1000*b* may be the same as the operation of MoT button 1000*a*.

Figures 11A, 11B, 11C:
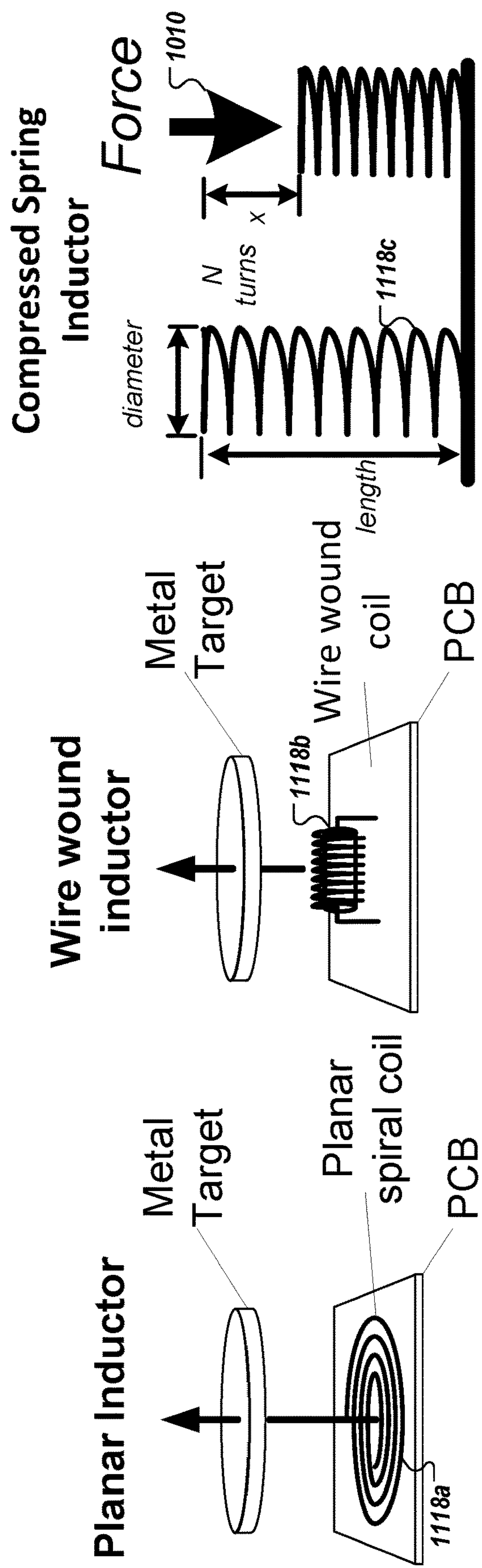
FIGS. 11A-11C are schematic illustrations of three inductor types for use as inductance sensor electrodes, according to various embodiments.

FIG. 10C illustrates an MoT button 1000*c*, similar to the MoT button 1000*b*, but with an alternatively shaped cavity. The cavity, as illustrated in FIG. 10C, may provide improved elasticity (or movement in the vertical plane) when the force 1010 (e.g., F) is applied. A cross section of the cavity may any suitable shape and various shapes may offer various advantages. The operation of MoT button 1000*c* may be the same as the operation of MoT buttons 1000*a* and 1000*b*. In FIGS. 10A-10C, a planar inductor is depicted as an example for illustrative purposes, and should not be regarded as restrictive. FIGS. 11A-11C illustrate various inductor types as examples, but is not intended to provide an exhaustive list.

FIGS. 11A-11C are schematic illustrations of three inductor types for use as inductance sensor electrodes, according to various embodiments. The LDC described in the present disclosure can include any type of inductive sensor electrode. In one embodiment, an inductor 1118*a* (e.g., an inductance sensor electrode) is a planar inductor, as illustrated in FIG. 11A. Inductor 1118*a* may be oriented so that a plane of inductor 1118*a* is parallel to a plane of the PCB. In another embodiment, an inductor 1118*b* may be a wire wound to form a coil, as illustrated in FIG. 11B. Inductor 1118*b* may be oriented with an axis of inductor 1118*b* parallel to a planar surface of the PCB. In another embodiment, an inductor 1118*c* may be a spring, as illustrated in FIG. 11C. The spring 1118*c* has an initial length, a diameter, and a number of turns denoted by N. In this case, an application of a force 1010 may compress the spring and change the length of the spring by length x, which is smaller than the initial length of spring 1118*c*.

Figure 12:
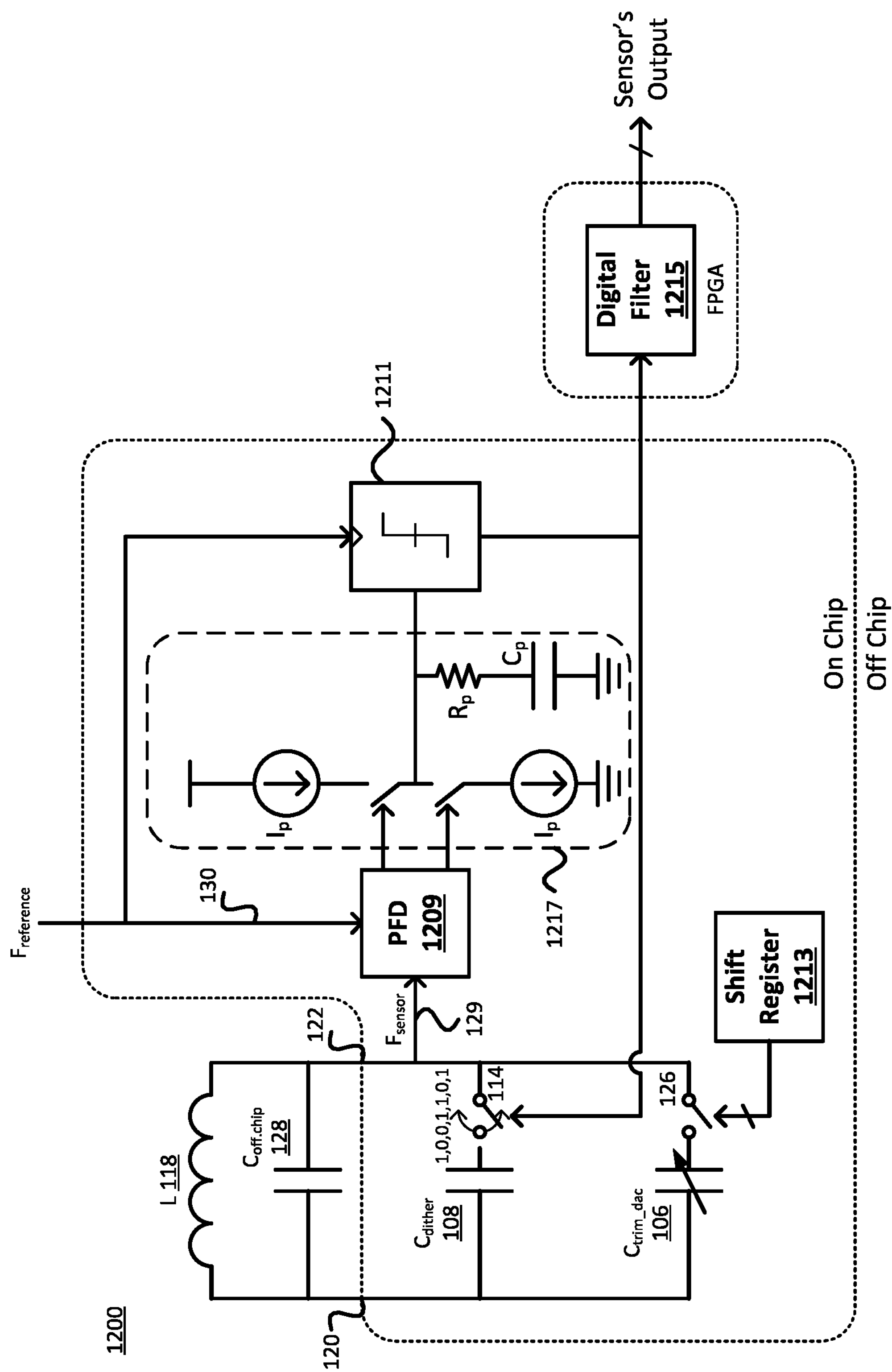
FIG. 12 is a block diagram of an inductive sensing circuit with an analog PLL, according to one embodiment.

FIG. 12 is a block diagram of an inductive sensing circuit 1200 with an analog PLL, according to one embodiment. Referring to FIG. 1, various components and parts may be the same or similar to the LDC of FIG. 1 as noted by similar reference numbers. The inductance sensor electrode (e.g., inductance sensor electrode 118) may be the same inductance sensor electrode as described in reference to FIG. 1. Capacitor 128, capacitor 106 (e.g., Ctrim_dac), capacitor 108 (e.g., Cdither), switches 114 and 126, signal 129 (e.g., F_sensor), the signal 130 (e.g., F_reference) may be the same or similar as described in reference to FIG. 1. In the current embodiment, inductive sensing circuit 1200 includes an analog feedback loop (e.g., a feedback loop with analog components).

Inductance sensor electrode 118 and capacitor 128 are coupled in parallel and are further coupled between a first terminal 120 and a second terminal 122 and is off chip. Capacitor 108 (e.g., Cdither) is coupled to first terminal 120 and to switch 114. Switch 114 selectively couples capacitor 108 to the second terminal 122. Capacitor 106 (e.g., Ctrim_dac) is coupled to first terminal 120 and to switch 126. Switch 126 selectively couples capacitor 106 the second terminal 122. Referring back to FIG. 7, in some embodiments, capacitor 106 may be first capacitor 705 and second capacitor 707 and switch 126 may be the switching circuitry including first switch 710, second switch 712, and third switch 714. In some embodiments, the switching circuitry can include both switch 126 and switch 114.

A shift register 1213 is coupled to switch 126. PFD 1209 is coupled to an output of the resonant circuit and receives a first input signal 129 (F_sensor) and receives a second input signal 130 (F_reference) from an internal clock. An output of the PFD 1209 is input into charge pump 1217 coupled to PFD 1209. Charge pump 1217 outputs positive and negative current pulses. Loop filter 1211 is coupled to an output of charge pump 1217 and filters the positive and negative current pulses for digital filter 1215.

Figure 13:
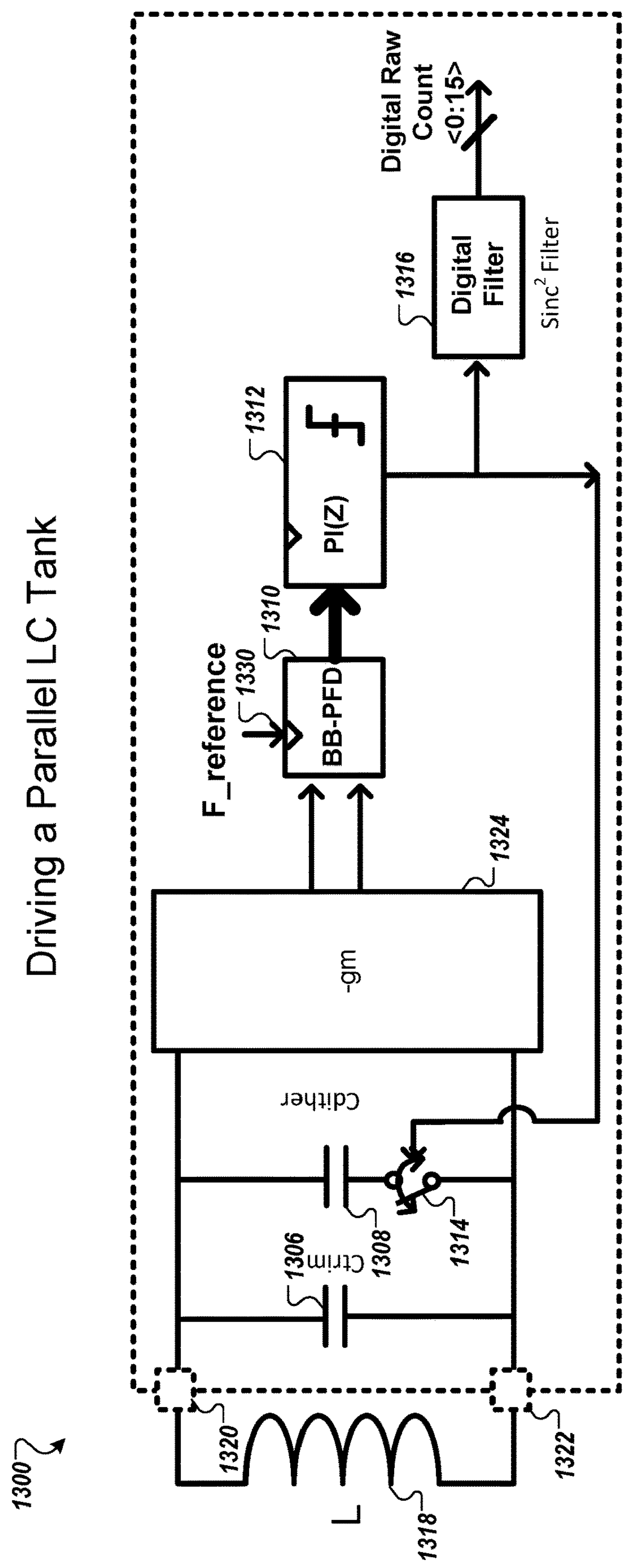
FIG. 13 is a block diagram illustrating an inductive sensing circuit with a parallel LC tank, according to one embodiment.

FIG. 13 is a block diagram illustrating an inductive sensing circuit 1300 with a parallel LC tank, according to one embodiment. Although not all components of the inductive sensing circuit are shown, the inductive sensing circuit 1300 is similar to inductance-sensing circuit 100 of FIG. 1, as noted by similar reference numbers. The resonant circuit including inductance sensor electrode 1318 (e.g., the inductor) and capacitor 1328, is driven in parallel to capacitor 1306 and capacitor 1308 by a current source 102 (not shown in FIG. 13). The LCO includes a cross-coupled differential transistor pair 104 (not shown in FIG. 13) coupled to the current source. Switch 1314 (or switching circuitry) selectively couples the capacitor in parallel to inductance sensor electrode 1318. A negative resistance component 1324 (any component that can provide a negative resistance) can be selectively coupled in parallel to the capacitor 1308 by the switch 1314. An output of the negative resistance component 1324 is an input into BB-PFD 1310. Referring to FIG. 1, in one embodiment, a digital feedback loop may be formed by BB-PFD 1310, PI controller 1312, and capacitor 1308. An output of the digital feedback loop is input into digital filter 1316. The output may represent how often capacitor 1308 (e.g., the dither capacitor) is switched. Digital filter 1316 can be any digital filter. In some embodiments, digital filter 1316 may be a $sinc^2$ filter. In some embodiments, digital filter 1316 may be a brick wall filter or an ideal low-pass filter. In other embodiments, the digital filter may be a decimator. Digital filter 1316 is configured to take a high frequency bitstream of capacitor 1308 (e.g., a dither capacitor or a capacitive element) and filter the high frequency bitstream to provide an output response (e.g., digital raw count <0:15>). In some embodiments, the frequency of the bitstream is less than 10 kHz, allowing for the use of a digital filter with similar bandwidth.

Figure 14:
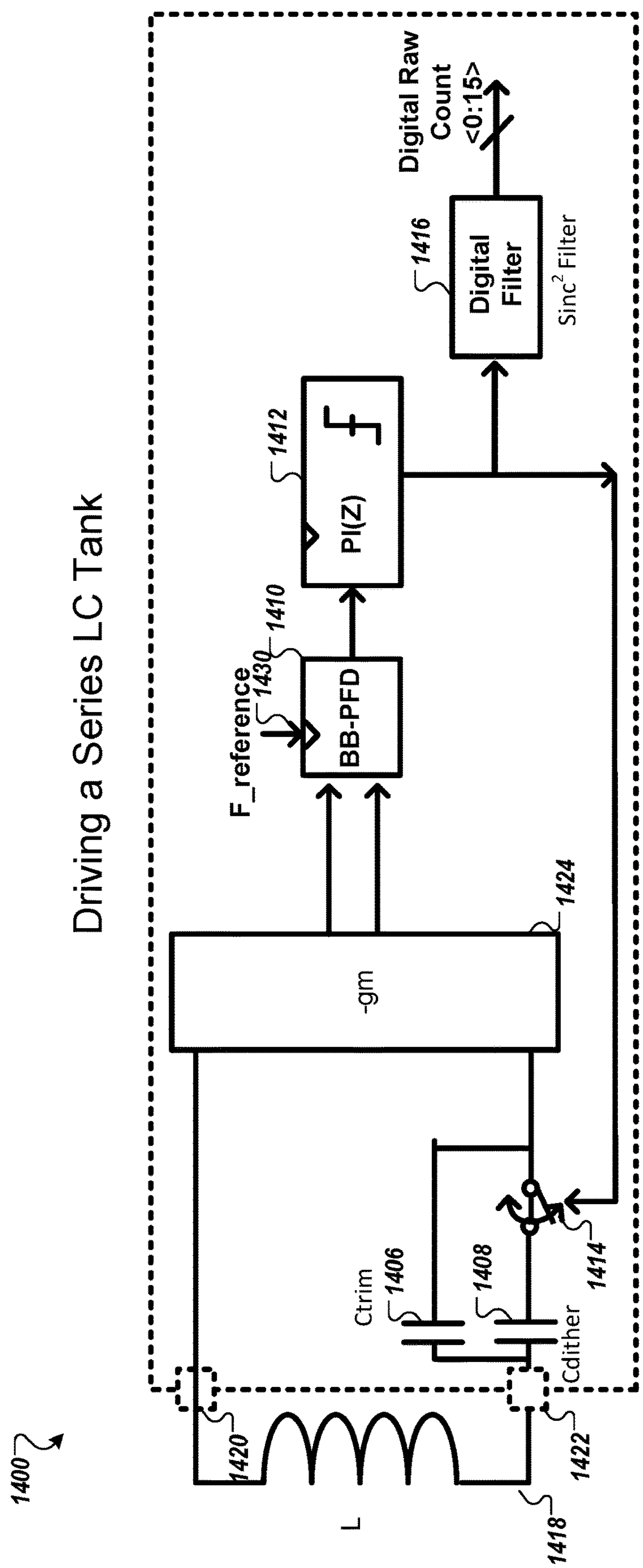
FIG. 14 is a block diagram illustrating an inductive sensing circuit with a series LC tank, according to one embodiment.

FIG. 14 is a block diagram illustrating an inductive sensing circuit 1400 with a series LC tank, according to one embodiment. Although not all components of the inductive sensing circuit are shown, the inductive sensing circuit 1400 is similar to inductance-sensing circuit 100 of FIG. 1, as noted by similar reference numbers. Referring to FIG. 1, the resonant circuit including inductance sensor electrode 1418 (e.g., the inductor) and a capacitor (not shown) is driven in series with capacitor 1406 and capacitor 1408 by a current source 102 (not shown in FIG. 14). Capacitor 1406 is in parallel to capacitor 1408. The inductive sensing circuit includes a cross-coupled differential transistor pair 104 (not shown in FIG. 14) coupled to the current source. Switch 1414 (or switching circuitry) selectively couples the capacitor in parallel to an inductive element 1418 of the resonant circuit. A negative resistance component 1424 can be selectively coupled to capacitors 1406 and 1408 by switch 1414. An output of negative resistance component 1424 is an input into BB-PFD 1410. Referring to FIG. 1, in one embodiment, a digital feedback loop may be formed by BB-PFD 1410, PI controller 1412, and capacitor 1408. An output of the digital feedback loop is input into digital filter 1416. The output may represent how often capacitor 1408 (e.g., the dither capacitor) is switched. Digital filter 1416 can be any digital filter. Digital filter 1416 is configured to take a high frequency bitstream of capacitor 1408 (e.g., a dither capacitor or a capacitive element) and filter the high frequency bitstream to provide an output response (e.g., digital raw count <0:15>). In some embodiments, the frequency of the bitstream is less than 10 kHz, allowing for the use of a digital filter with similar bandwidth.

Figure 15:
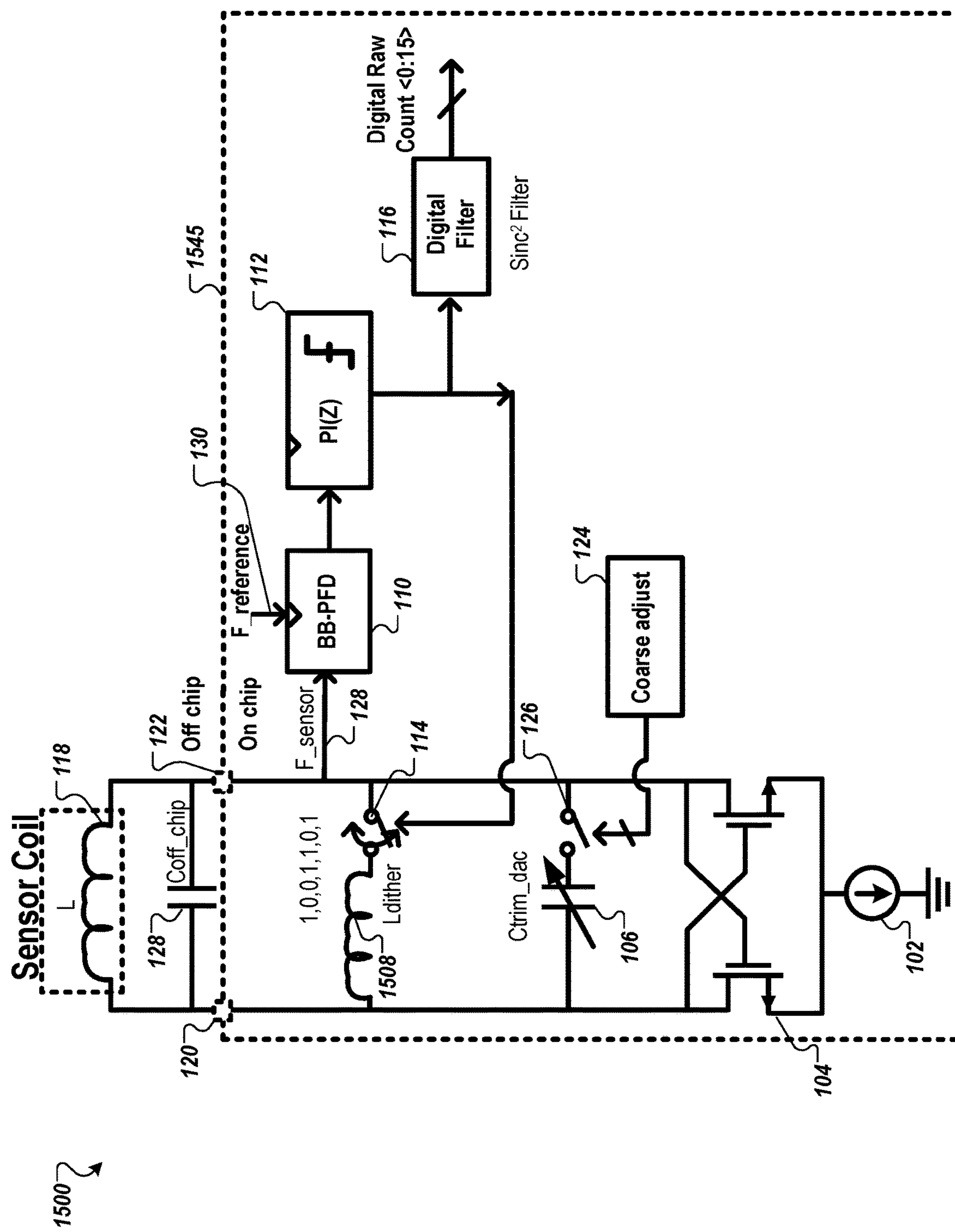
FIG. 15 is block diagram of an inductive sensing circuit with a digital control loop and a digital filter to measure an inductance change of an inductance sensor electrode and convert the inductance change to a digital value, according to one embodiment.

FIG. 15 is block diagram of an inductive sensing circuit 1500 with a digital control loop and a digital filter 116 to measure an inductance change of an inductance sensor electrode 118 and convert the inductance change to a digital value, according to one embodiment. In some embodiments, the digital control loop may be a digital feedback loop. In other embodiments, the control loop may be an analog control loop instead of a digital control loop. The resonant circuit forms an oscillator in the digital control loop. The digital control loop is configured to maintain a fixed frequency (or a constant frequency) in the resonant circuit. An output of the digital control loop is proportional to the inductance change of an inductor (or inductance sensor electrode). In some embodiments, inductance sensor electrode 118 may be an inductor, an inductive sensor, an inductive coil, an inductive element, or the like. In some embodiments, the resonant circuit may include an inductance sensor electrode 118 and a capacitor 128, an inductor and a capacitor, or the like. In some embodiments, the capacitor may be a capacitive element.

Inductor 1508 (Ldither) is coupled between a first terminal 120 and a second terminal 122. In some embodiments, inductor 1508 may be a dither inductor or an inductive element. Inductor 1508 is coupled to a first switching circuitry 114 (e.g., a switch), which may selectively couple the inductor 1508 to the second terminal 122. The inductive sensing circuit 1500 further includes a current source 102. A cross-coupled differential transistor pair 104 is coupled to current source 102. A second capacitor 106 is coupled to the first terminal 120 and is further coupled to a second switching circuitry 126 (e.g., a switch). In some embodiments, the second capacitor 106 may be a capacitive element. The second switching circuitry 126 selectively couples the second capacitor 106 to the second terminal 122. In some embodiments, a capacitance of the second capacitor 106 may be variable. In some embodiments, the capacitance of the second capacitor 106 may be programmable. Alternatively, the second capacitor may be implemented as more than one capacitors (e.g., two capacitors, three capacitors, or some number of capacitors) and switching circuitry 126 may be to selectively couple the more than one capacitors to the second terminal 122 in order to control the capacitance. Coarse adjust circuitry 124 is coupled to switching circuitry 126. Coarse adjust circuitry 124 may receive a signal from PI controller 112 to control switching circuitry 126 in order to selectively couple the more than one capacitors to the second terminal 122. In one embodiment, coarse adjust circuitry 124 sets a digital value that controls (e.g., adjusts) a capacitance. In some embodiments, the capacitance can be controlled with a digital value. In one embodiment, the more than one capacitors with switching circuitry 126 and coarse adjust circuitry 124 form a variable capacitance circuit in which a digital value is an input and the capacitance is an output.

The inductive sensing circuit further includes a digital PLL coupled to the second terminal 122. The digital PLL receives a first input signal 129 (e.g., F_sensor) indicating a sensor frequency (fsen) of the oscillator and a second input signal 130 (e.g., F_reference) indicating a reference frequency (fref) (e.g., of an internal reference clock). The digital PLL outputs a digital bitstream as a control signal. In some embodiments, the digital bitstream may be a dither capacitor bitstream or a Cdither bitstream. Switching circuitry 114 receives the control signal in order to selectively couple inductor 1508 (Ldither) to the second terminal 122 to maintain the fixed frequency in the resonant circuit according to the digital bitstream. Digital filter 116 is configured to receive the digital bitstream as an input and is further configured to output the digital value. In some embodiments, digital filter 116 may be a $\text{sinc}^2$ filter. In some embodiments, digital filter 116 may be a brick wall filter or an ideal low-pass filter. In other embodiments, the digital filter may be a decimator. The digital PLL further includes a PFD 110 and a proportional integral (PI) controller 112. In some embodiments, phase frequency detector 110 may be a bang-bang PFD (BB-PFD).

Inductive sensing circuit 1500 includes an on-chip region and an off-chip region. The on-chip region is an LDC 1545 and includes current source 102, cross-coupled differential transistor pair 104, capacitor 106 and inductor 1508, switching circuitries 114 and 126, coarse adjust circuitry 124, PFD 110, PI controller 112, and digital filter 116. The digital control loop includes PFD 110, PI controller 112, inductor 1508, and switching circuitry 114. The off-chip region includes capacitor 128 and inductive sensor electrode 118. An LC tank or an LCO includes inductive sensor electrode 118 and capacitor 128.

In some embodiments, capacitors 106 and 128 may be capacitive elements. Inductors 118 and 1508 may be inductive elements.

The inductance-sensing circuit may be used for proximity detection for human interface on a wide variety of materials including both ferrous and non-ferrous materials. The inductive sensor electrode is an inductive coil 118 that can be formed using copper trace on a PCB. Inductance sensor electrode 118 (e.g., the inductance sensor electrode) coupled in parallel to capacitor 128 forms and LC tank. The LC tank can be driven at a resonance frequency (e.g., the resonance frequency of an LC circuit). The signal from the LC tank is then used as an input for phase detector 110 (e.g., BB-PFD) and PI controller 112 and is digitized by digital filter 116. A metal object, when placed in proximity to the inductance sensor electrode, changes the amplitude of oscillation and the frequency (e.g., the resonant frequency) of oscillation of the resonant circuit. In an inductance method, the change in the resonant frequency is measured. In operation, a button may be formed with a metal object, and when pressed (e.g., deflected), the resonant frequency of the resonant circuit is changed can be sensed (e.g., measured).

In the depicted embodiment, the inductive sensing circuit 1500 includes an oscillator (e.g., oscillator front end) which includes current source 102 coupled to cross coupled differential pair 104, capacitor 106 (e.g., the capacitor DAC), and inductor 1508 (e.g., the dither inductor). In one embodiment, the oscillator may be an LC oscillator. In some embodiments, the oscillator may be a current-controlled oscillator or a VCO. Phase detector 110 (e.g., the BB-PFD) is coupled to PI controller 112 to control dither capacitor 108. Digital filter 116 filters the output of PI controller 112 and output a digital raw count value (e.g., depicted as <0:15> in FIG. 1). Inductance sensor electrode 118 is placed across the terminals (e.g., between a first terminal and a second terminal). The LC tank (e.g., inductor 118 coupled with capacitor 128) oscillates at the resonant frequency (e.g., the sensor frequency, or fsen). Capacitor 106 brings the sensor frequency closer to the reference frequency (e.g., fref), which allows dither inductor 1508 to be selectively coupled via switch 114 to adjust the sensor frequency (fsen).

The digital feedback loop (e.g., digital control loop) is formed by phase detector 110, PI controller 112, and dither inductor 1508. The feedback loop compares the LC tank frequency of operation (e.g., the sensor frequency, or fsen) to a reference clock source (e.g., the reference frequency, or fref). The digital feedback loop maintains the resonant frequency of operation the same as the reference frequency by switching dither inductor 1508 in and out of the loop via switch 114.

When a target approaches the inductance sensor electrode, a change in the inductance L of the inductance sensor electrode is induced, which causes a shift (e.g., a change) in the resonant frequency. The digital feedback loop is configured to compensate for the change in inductance (and therefore the change in resonant frequency) by controlling a duty cycle of dither capacitor 108 (e.g., by changing how often switch 114 switches on and off, or how often the dither capacitor is switched in and out of the digital feedback loop), causing the sensor frequency to be equal to the reference frequency. PI controller 112 then outputs a digital value representing the frequency that dither inductor 1508 is switched. The output of PI controller 112 is filtered by digital filter 116 to get a final digital raw count value.

In some embodiments, a dither capacitor can be used in combination with dither inductor 1508. In one embodiment, the dither capacitor can be coupled in parallel with dither inductor 1508. In another embodiment, the dither capacitor can be coupled in series with dither inductor 1508. In one embodiment, the dither capacitor and dither inductor 1508 can be switched at the same time. In another embodiment, the dither capacitor and dither inductor 1508 can be switched independently.

Figure 16:
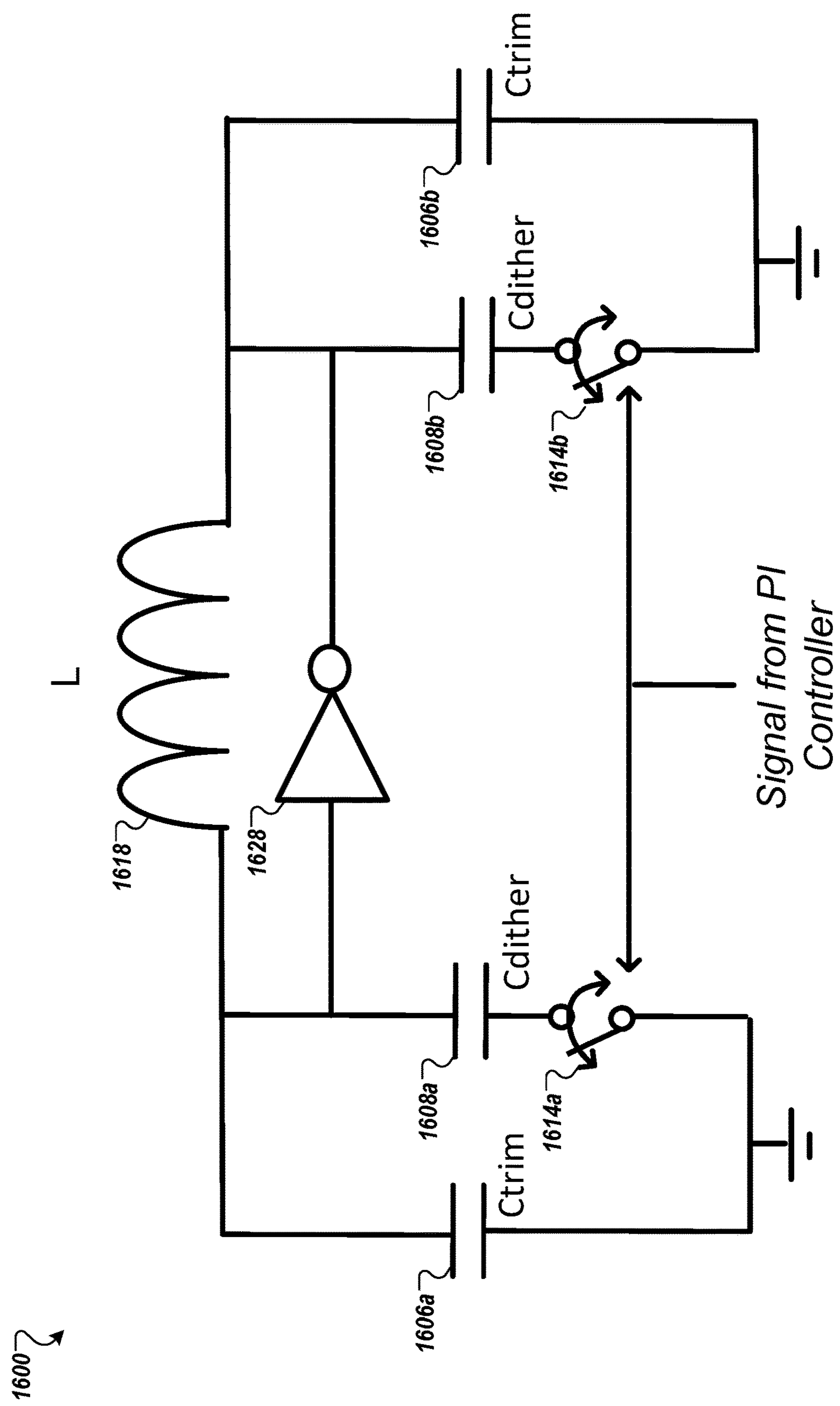
FIG. 16 is a block diagram of a Pierce oscillator of an inductance sensing circuit, according to one embodiment.

FIG. 16 is a block diagram of a Pierce oscillator 1600 of an inductive sensing circuit, according to one embodiment. Referring to FIG. 1, various components and parts may be the same or similar to the inductive sensing circuit of FIG. 1 as noted by similar reference numbers. A Pierce oscillator may include inductance sensor electrode 1618 (e.g., sensor coil, inductor, inductor coil) coupled in parallel to inverter 1628 (e.g., digital inverter or NOT gate). The inductance sensor electrode 1618 and the inverter 1628 are coupled between capacitors 1606*a* and 1606*b*. Switches 1614*a* and 1614*b* (e.g., switching circuitry) are coupled to capacitors 1608*a* and 1608*b* in order to selectively couple capacitors 1608*a* and 1608*b* to inductance sensor electrode 1618 and inverter 1628, based on a control signal from a PI controller.

Figure 17:
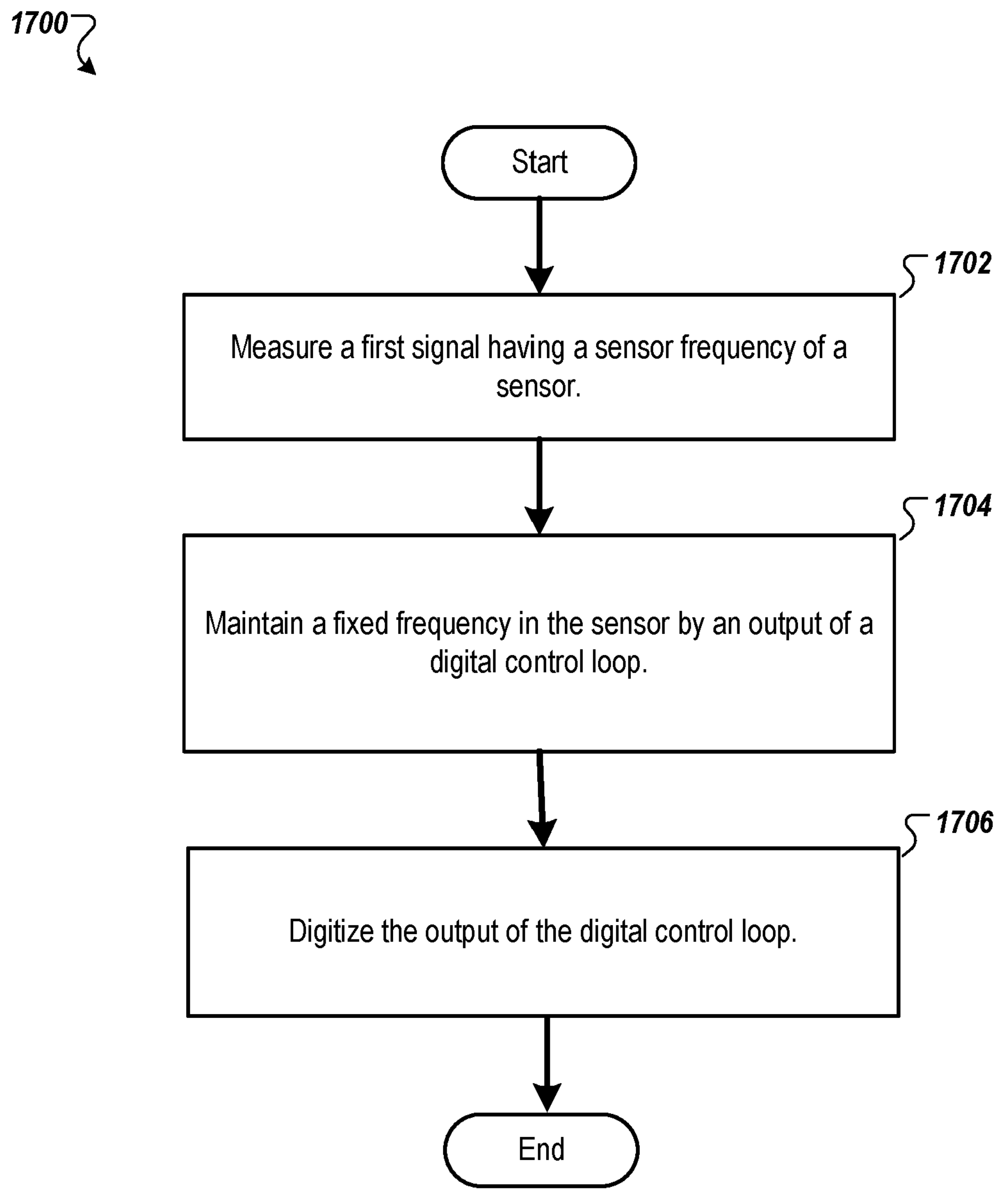
FIG. 17 is a flow diagram of a method of sensing a change of inductance of an inductance sensor electrode according to one embodiment.

FIG. 17 is a flow diagram of a method 1700 of sensing a change of inductance of an inductance sensor electrode according to one embodiment. The method 1700 may be performed by processing logic that comprises hardware (e.g., circuitry, dedicated logic, programmable logic, micro-code, etc.), software, firmware, or a combination thereof. In one embodiment, an inductive sensing circuit performs the method 1700. In another embodiment, the inductance-sensing circuit 100 of FIG. 1 performs the method 1700. In another embodiment, the MoT button 900*a* of FIG. 9A performs the method 1700. In another embodiment, the MoT button 900*b* of FIG. 9B performs the method 1700. In another embodiment, the MoT button 1000*a* of FIG. 10A performs the method 1700. In another embodiment, the MoT button 1000*b* of FIG. 10B performs the method 1700. In another embodiment, the MoT button 1000*c* of FIG. 10C performs the method 1700. In another embodiment, the inductive sensing circuit 1200 of FIG. 12 performs the method 1700. In another embodiment, the inductive sensing circuit 1300 of FIG. 13 performs the method 1700. In another embodiment, the inductive sensing circuit 1400 of FIG. 14 performs the method 1700. In another embodiment, the inductive sensing circuit 1500 of FIG. 15 performs the method 1700.

Referring to FIG. 17, the method 1700 begins by the processing logic measuring a first signal having a sensor frequency of a resonant circuit (block 1702). The inductance sensor electrode may be part of a digital control loop of an inductive sensing circuit. The frequency of the first signal may depend on a proximity (e.g., metal, a metallic object, or the like) of an object to the inductance sensor electrode. The processing logic maintains a fixed frequency in the resonant circuit by an output of the digital control loop (block 1704). Maintaining a fixed frequency can mean that the processing logic controls the frequency of oscillation of the LCO circuitry (e.g., the inductor and capacitor circuitry) to stay the same regardless of the proximity of the object to the inductance sensor electrode. In particular, the frequency of the first signal may be maintained to be the same as a frequency of a reference signal. The processing logic then digitizes the output of the digital control loop (block 1706). The output of the digital control loop may be proportional to an inductance change of the inductance sensor electrode (e.g., as the proximity of the object to the inductance sensor electrode changes); and the method 1700 ends.

In another embodiment, the processing logic compares the first signal and a second signal, the second signal being indicative of the fixed frequency. The second signal may be the reference signal and the fixed frequency may be the frequency of the reference signal. The processing logic then generates a digital bitstream based on the comparing of the first signal and the second signal. The digital bitstream may be filtered by a digital filter to output a digital raw count. The processing logic may then selectively couple a capacitor or an inductor to the resonant circuit based on the comparing of the first signal and the second signal, and based on the digital bitstream. The digital bitstream is indicative of the number of times the capacitor or inductor is switched into the resonant circuit.

In some embodiments, it may be desirable to use an LCO for agricultural applications. The following descriptions relating for FIGS. 18-19 relate to potential difficulties and solutions for applying an LCO for agricultural applications, such as ground-water measurements where ground-water concentration is determined by measuring the average dielectric of the ground in a volume of soil at a number of sub-surface depths, typically in the root zone. The relative dielectric constant of water is many times larger than the relative dielectric constant of soil, so that the capacitance measured is directly proportional to the ground-water concentration.

An LCO may only allow a single oscillator for each sensor. This may not be suitable for agricultural applications, which may require more than one channel for measurements. An LCO may include a single inductor and a single capacitor coupled in parallel. In one embodiment, the LCO can measure a change in capacitance with a fixed inductor. In this LCO, a separate oscillator for each sensor in an array of sensors is required, which can result in a complex, expensive, and power hungry LCO.

In another embodiment the LCO can measure a change in distance from the coil to a conductive target. This is done with a fixed capacitor and the inductance varying with distance, resulting in an LCO frequency that varies with distance. Alternatively, in order to measure a change an inductance, the LCO may be driven off-resonance and measuring the amplitude response of the LCO. This may lead to decreased performance capabilities because inductive sensors driven off resonance may be sensitive to temperature (e.g., due to a resistance of the coil and the temperature dependence of the resistance) as well as to a distance of a target (e.g., an object to be sensed by the LCO) to the sensor.

To address the above-mentioned and other challenges without additional logic and circuits, a programmable LCO with a multiplexed connection may be implemented. The multiplex connection allows for the use of a single oscillator to individually or sequentially scan multiple channels.

Figure 18:
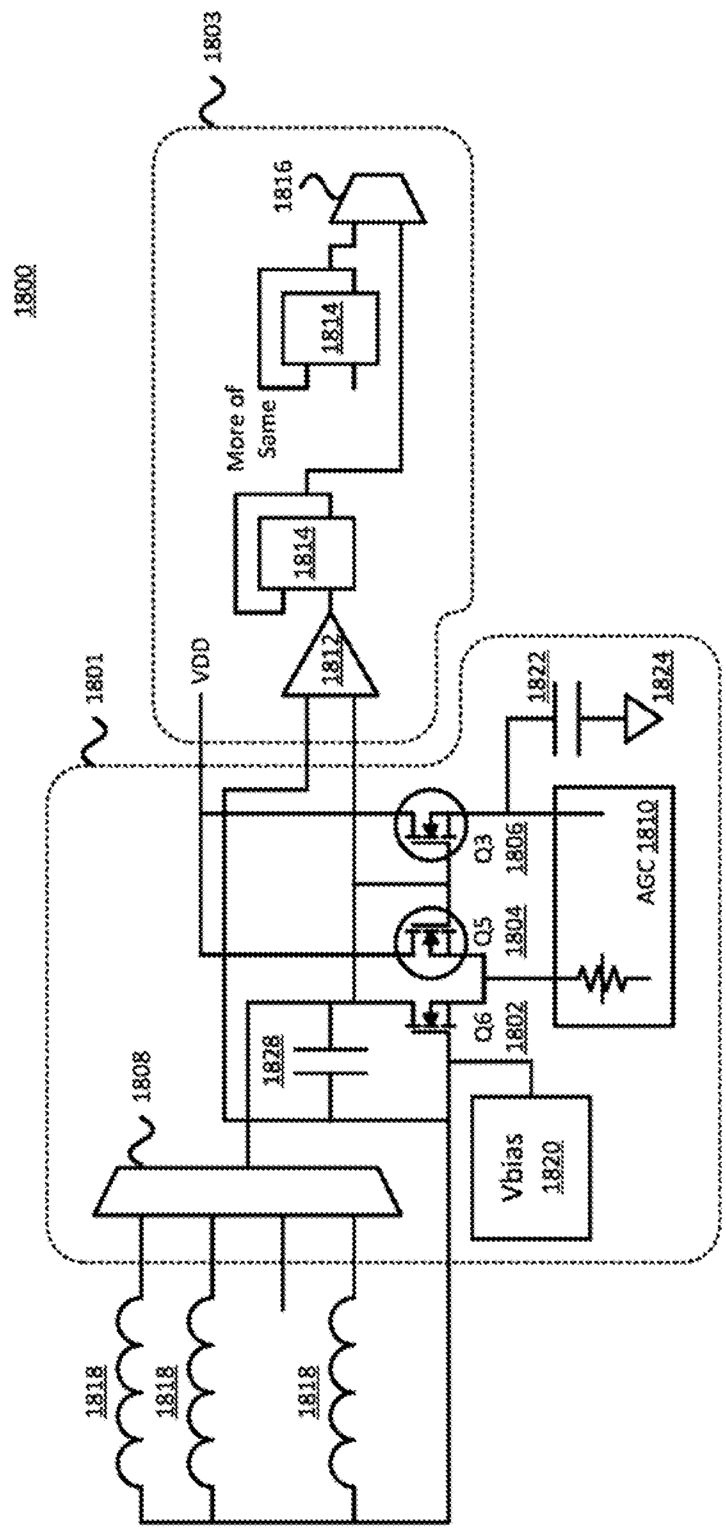
FIG. 18 is a block diagram of a Colpitts oscillator with inductive operation, according to one embodiment.

FIG. 18 is a block diagram of a Colpitts oscillator 1800 with inductive operation, according to one embodiment. Colpitts oscillator 1800 can be used in inductive sensors, in particular for user interface in extreme environments. Colpitts oscillator 1800 includes a plurality of inductive elements 1818. Inductive elements 1818 may be inductors, inductor coils, sensors, or the like. Inductive elements 1818 are coupled from a drain node of transistor 1802 to a gate node of transistor 1802. Inductive elements 1818 supply a DC bias point to transistor 1804. Inductive elements are coupled to an inductive measurement circuit 1801. Inductive measurement circuit 1801 selectively couples an inductive element of the plurality of inductive elements to a capacitor 1828 of inductive measurement circuit 1801. When a sense measurement occurs, inductive measurement circuit 1801 can detect a change in inductance of the inductive element and output a first signal with a first frequency. The first signal can be modeled as a sine wave, a cosine wave, a periodic mathematical function, or the like. Inductive measurement circuit 1801 includes a multiplexer 1808 coupled to the plurality of inductive elements 1818. Multiplexer 1808 can be a selection circuit, an analog mux bus, or the like. Multiplexer 1808 selectively couples an inductor (or inductive element) to capacitor 1828. Each inductive element 1818 (e.g., sensor) can be evaluated individually or sequentially, limiting the number of required oscillators to one, instead of requiring a separate oscillator for each sensor. A voltage bias circuit 1820 is further coupled to the plurality of inductive elements 1818. Capacitor 1828 is coupled between voltage bias circuit 1820 and an output of multiplexer 1808. The inductive measurement circuit further includes a feedback circuit. The oscillator circuit includes a transistor 1802 coupled to the output of multiplexer 1808, a transistor 1804 coupled between transistor 1802 to switch the current in transistor 1804, and a transistor 1806. Transistor 1806 buffers the output at the drain of transistor 1802 and is coupled to capacitor 1822 which is coupled to a ground potential 1824 to implement a peak detector. An automatic gain control (AGC) 1810 is coupled between the drains of transistors 1802 and 1804 and the source of transistor 1806. AGC 1810 operates to limit the operating current to transistors 1802 and 1804 to maintain sinusoidal operation. Transistors 1802, 1804, and 1806 can be FET or MOSFET (e.g., N-FET or P-FET) transistors, or bipolar transistors (e.g., NPN transistors or PNP transistors), or a combination thereof. An output at the drain node of transistor 1802 feeds a gate of transistor 1806. Transistor 1802 receives the first signal from the output of multiplexer 1808. In one embodiment, the feedback loop detects a level of the first signal at a drain node of transistor 1802 and increases a voltage at a source node of transistor 1806. In some embodiments, the first signal is fed back to reduce the bias current for the differential pair which comprises the oscillator. The level of the first signal may be an amplitude of a current, an amplitude of a voltage, or any combination thereof. Inductive measurement circuit 1801 is coupled to a frequency divider circuit 1803. Frequency divider circuit 1803 generates an output signal with a frequency that is less than the first frequency. Frequency divider circuit 1803 includes a comparator 1812 coupled to an output of the oscillator at transistor 1802 drain. The drain of transistor 1802 drives comparator 1812. Comparator 1812 is referenced to bias voltage 1820. Comparator 1812 can be a self-biased comparator, a high-speed comparator, or the like, to convert the first signal into a second signal. In one embodiment, the second signal may be a square wave for a counter. In other embodiments, the second signal may be a saw tooth function, a delta functions, or other periodic functions for a counter. A plurality of latch circuits 1814 is coupled an output of comparator 1812. In some embodiments, the latch circuits can be a series of toggling flip-flops, a high-speed ripple counter with selectable length, or the like. Comparator 1812 drives latch circuits 1814 in order to reduce the operating frequency to a range which is readily countable (e.g., by a microcontroller). Flip/flop circuits 1814 generate a third signal, based on the second signal, with a second frequency that is less than the first frequency. A divider chain 1816 is coupled to the plurality of flip/flops 1814. Divider chain 1816 generates a fourth signal with a third frequency that is less than the second frequency.

Inductive sensors of this type typically operate between 1 MHz and 10 MHz. A short divider chain 1816 may be required to bring the frequency of the inductive sensor to the operating range of a microcontroller (e.g., the PSoC® processing device, such as that used in the PSoC3® family of products offered by Cypress Semiconductor Corporation (San Jose, California)), because digital inputs are registered by a system clock, which may limit the maximum operating frequency. The output of Colpitts oscillator 1800 is a direct frequency measurement with a resolution that depends on a sampling time. Sequential operation is sufficient, and simultaneous circuits may not be required. Application of Colpitts oscillator 1800 offers a reduced number of connections and better temperature stability.

Figure 19:
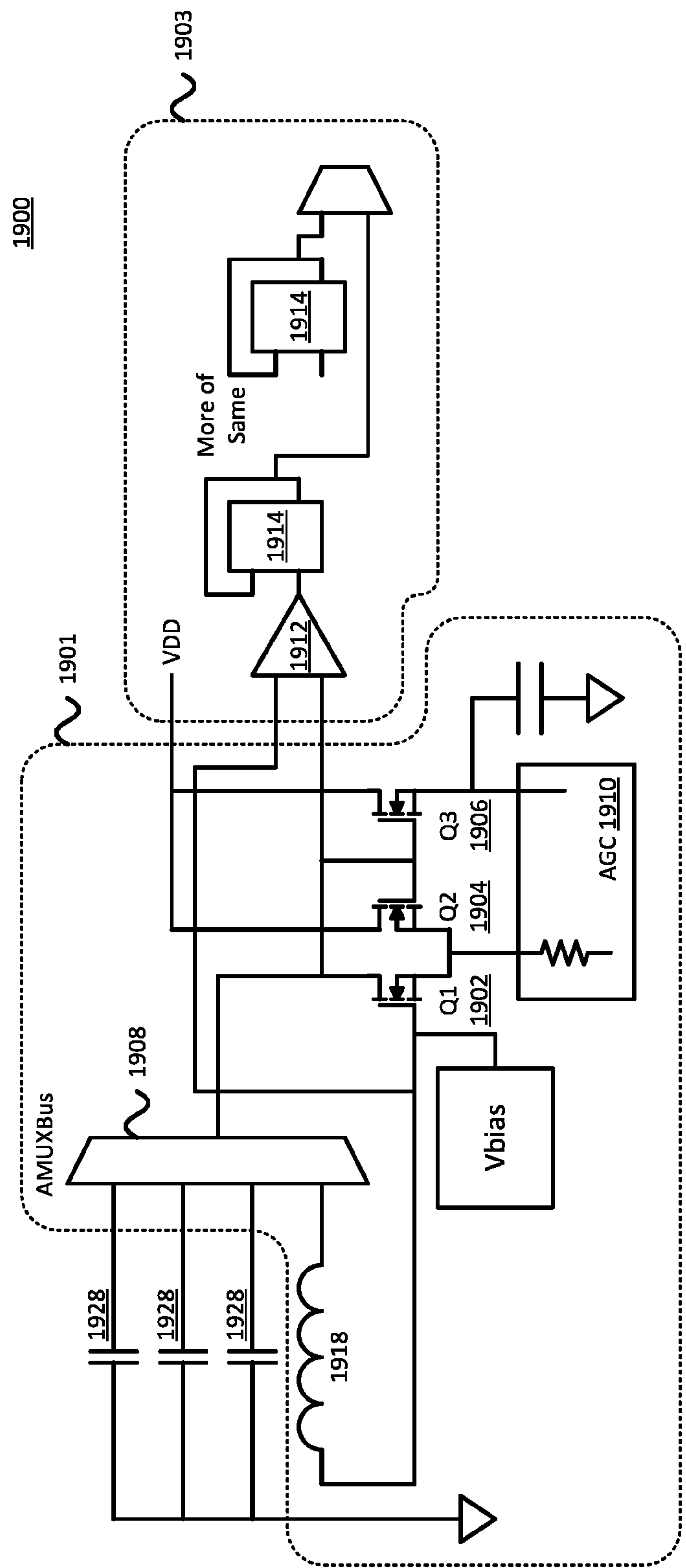
FIG. 19 is a block diagram of a Colpitts oscillator with capacitive operation, according to one embodiment.

FIG. 19 is a block diagram of a Colpitts oscillator 1900 with capacitive operation, according to one embodiment. Colpitts oscillator 1900 may be used in ground water sensors at high frequencies for agricultural applications. Colpitts oscillator 1900 is similar to Colpitts oscillator 1800, except relies on capacitance measurement instead of inductive measurement. Components of Colpitts oscillator 1900 that are the same or similar to components of Colpitts oscillator 1800 are denoted by similar reference numbers. One channel of a multiplexer has a fixed inductor 1918 and sensor capacitances of capacitors 1928 are multiplexed. Colpitts oscillator 1900 includes a plurality of capacitive elements 1928. Capacitive elements 1928 may be capacitors, capacitive elements, sensors, or the like. Capacitive elements 1928 are coupled from a drain node of transistor 1902 to a gate node of transistor 1902. Inductor 1918 supplies a DC bias point to the gate of transistor 1904. The capacitive elements are coupled to a capacitive measurement circuit 1901. Capacitive measurement circuit 1901 selectively couples a capacitive element of the plurality of capacitive elements to an inductor 1918 of the capacitive measurement circuit 1901. When a sense measurement occurs, the capacitive measurement circuit 1901 can detect a change in capacitance (e.g., a capacitance change) of the capacitive element and output a first signal with a first frequency. The first signal can be modeled as a sine wave, a cosine wave, a periodic mathematical function, or the like. Capacitive measurement circuit 1901 includes a multiplexer 1908 coupled to the plurality of capacitive elements 1928. Multiplexer 1908 can be a selection circuit, an analog mux bus, or the like. Multiplexer 1908 selectively couples the capacitor (or capacitive element) of the plurality of capacitive elements to inductor 1918. Each capacitive element 1928 (e.g., sensor) can be evaluated individually and sequentially, limiting the number of required oscillators to one, instead of requiring a separate oscillator for each sensor. A voltage bias circuit 1920 is further coupled to the plurality of capacitive elements 1928. Inductor 1918 is coupled between voltage bias circuit 1920 and multiplexer 1908. The inductive measurement circuit further includes a feedback circuit. The feedback circuit includes a transistor 1902 coupled to the output of multiplexer 1908, a transistor 1904 coupled between transistor 1902 and a transistor 1906. Transistor 1906 is coupled to capacitor 1922, which is coupled to a ground potential 1924 to form a peak detector. An automatic gain control (AGC) 1910 is coupled between transistor 1902 and transistor 1906. AGC 1910 operates to limit the common bias current to transistors 1902 and 1904 to maintain sinusoidal operation. Transistors 1902, 1904, and 1906 can be MOSFET (N-FET or P-FET) or bipolar transistors (e.g., NPN transistors or PNP transistors or a combination thereof.

An output at the drain node of transistor 1902 feeds a gate node of transistor 1904 and transistor 1906. Transistor 1902 receives the first signal from the output of multiplexer 1908. In one embodiment, the feedback loop detects a level of the first signal at a drain node of transistor 1902 and increases a voltage at a source node of the transistor 1906. In some embodiments, the first signal is fed back to reduce the bias current for the differential pair. The level of the first signal may be an amplitude of a current, an amplitude of a voltage, or any combination thereof. Capacitive measurement circuit 1901 is coupled to a frequency divider circuit 1903. Frequency divider circuit 1903 generates an output signal with a frequency that is less than the first frequency. Frequency divider circuit 1803 includes a comparator 1912 coupled to an output of the feedback circuit. Comparator 1912 can be a self-biased comparator, a high-speed comparator, or the like, to convert the first signal into a second signal. The drain node of transistor 1902 drives comparator 1912. In one embodiment, the second signal may be a square wave for a counter. In other embodiments, the second signal may be a saw tooth function, a delta functions, or other periodic functions for a counter. A plurality of flip/flop circuits 1914 is coupled an output of comparator 1912. In some embodiments, the latch circuits can be a series of flip-flops, a high-speed ripple counter with selectable length, or the like. Comparator 1912 drives flip/flop circuits 1914 in order to reduce the operating frequency to a range which is readily countable (e.g., by a microcontroller). Latch circuits 1914 generate a third signal, based on the second signal, with a second frequency that is less than the first frequency. A divider chain 1916 is coupled to the plurality of latch circuits 1914. Divider chain 1916 generates a fourth signal with a third frequency that is less than the second frequency.

Colpitts oscillator 1900 may be a system that capacitively measures ground water (e.g., a dielectric constant of ground water or a presence of ground water). To measure ground water, Colpitts oscillator 1900 operates between 70 MHz and 130 MHz. Dielectric characteristics of water requires sensors to operate between 70 MHz and 130 MHz for repeatable operation. This range of frequencies may be higher than a bandwidth of a PSoC analog mux bus, so a multiplexer with a higher bandwidth should be used. The output of Colpitts oscillator 1900 is a direct frequency measurement with a resolution that depends on a sampling time. A typical sensor reporting is a ratio of a measured frequency and a maximum frequency when the sensor is in air. Application of Colpitts oscillator 1900 offers reduced complexity and reduced cost.

Figure 20:
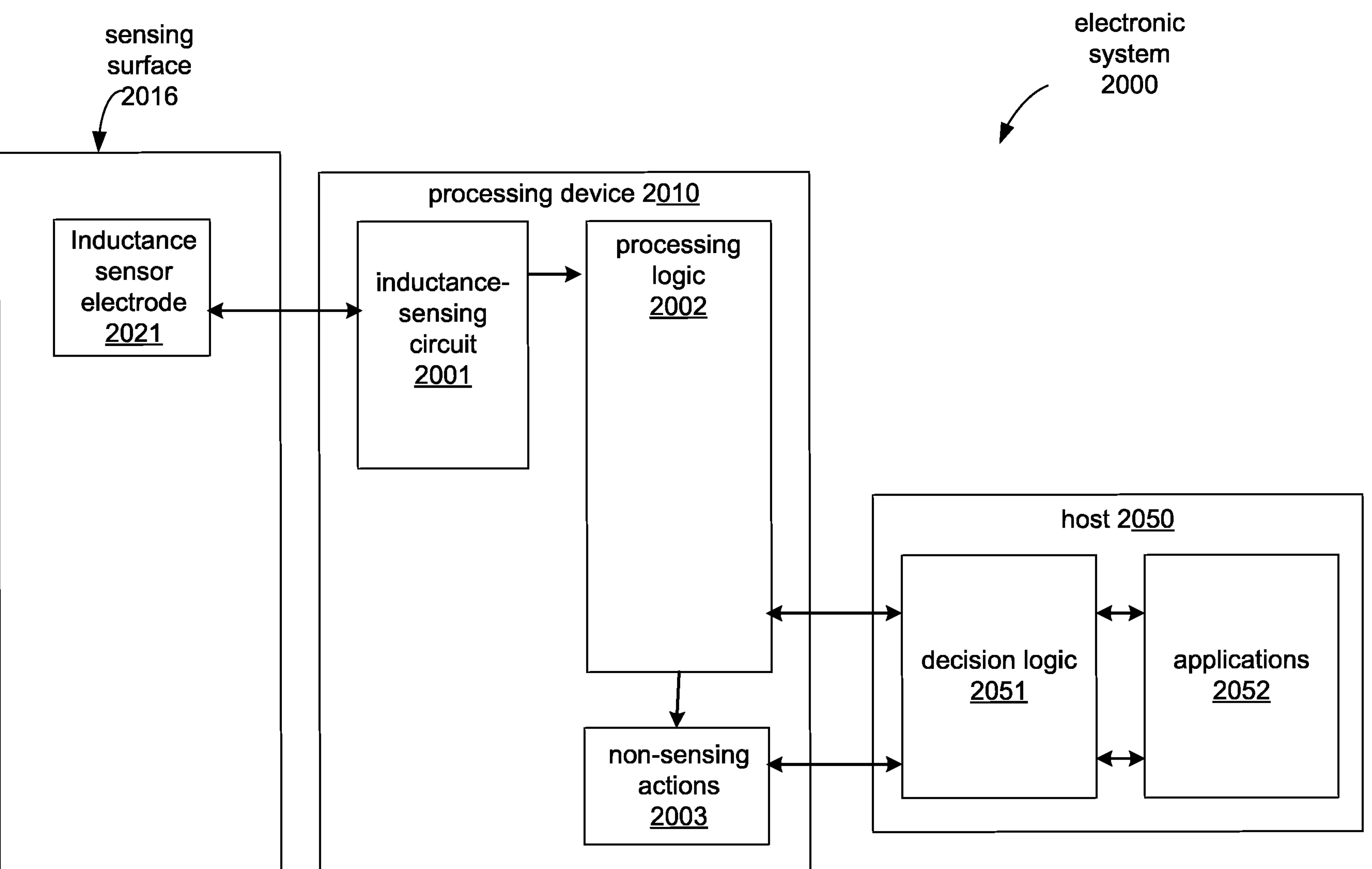
FIG. 20 is a block diagram illustrating an electronic system that processes inductive sensing data according to one embodiment.

FIG. 20 is a block diagram illustrating an electronic system 2000 that processes inductive sensing data according to one embodiment. FIG. 20 illustrates an electronic system 2000 including a processing device 2010 that may be configured to measure inductances from an inductance sensor electrode 2021. In some embodiments, sensor electrode 2021 may be an inductor, an inductor coil, an inductive element, or the like. In one embodiment, sensing circuit 2001 with a metal overlay forms an inductive sensing button. The inductive sensing button (which may be a touchscreen, a touch pad, a metal over touch (MoT) button, or the like) is coupled to processing device 2010, which is coupled to a host 2050. In one embodiment, the inductive sensing button uses processing device 2010 to detect deflections of a surface of the button.

In one embodiment, electronic system 2000 includes sensor electrode 2021 (such as an inductor sensor electrode) designed to detect a proximity of a conductive object, such as deflections of a surface of a button (or a metal object within proximity of the sensor), a presence of a conductive object, a presence of a ferrous or non-ferrous metal, or the like. The inductance sensor electrode (e.g., inductor, or inductive coil) forms a resonant circuit (e.g., LC tank) with a first capacitor (not shown in FIG. 20). The resonant circuit may be driven by a current source at a resonant frequency of the LC tank. If there is no deflection of the surface of the button, a signal from the sensor will have a sensor frequency equal to the resonant frequency. An internal clock signal (e.g., a reference signal) may be designed to have a reference frequency equal to the resonant frequency of the resonant circuit (LC tank). When a metal object is detected in proximity of the sensor (e.g., when the surface of the button is deflected), the resonant circuit may have a sensor signal with a frequency that is shifted with respect to the resonant frequency. In order to detect the deflection of the surface of the button, the inductive sensing circuit may have a digital control loop to compare the frequency of the sensor signal (e.g., the sensor frequency) and the frequency of the reference signal (e.g., the reference frequency). If the sensor frequency is different than the reference frequency (e.g., due to the deflection of the surface of the button) the digital control loop may switch a first capacitor to be part of the resonant circuit in order to bring the frequency of the sensor signal back to the resonant frequency (e.g., to match the frequency of the reference signal). The digital control loop further outputs a bitstream indicating a number of times that the first capacitor is switched in or out of the resonant circuit. A digital filter is coupled to the digital feedback loop and the digital filter filters the bitstream in order to produce a digital raw count. The digital raw count may be processed by the processing logic and communicated to a host.

Inductance sensor electrode 2021 may be disposed below the surface of the button such that when the button is pressed or there is a force applied to the button, the surface of the button does not directly contact the sensor, but instead changes its proximity to inductance sensor electrode 2021. The sensor electrode may be disposed to have a flat profile. Alternatively, the sensor electrode may have a winding profile or a compressed spring profile. In one embodiment, the sensor electrode may be part of a MoT button. In other embodiments, the sensor electrode may be to measure or sense a proximity of a metal object. In another embodiment, inductance sensor electrode 2021 can be included in a non-transparent inductive sense array (e.g., PC touchpad). In one embodiment, the sense array is configured so that processing device 2010 may generate sense data for a deflection of the surface of a button proximate to the inductance sensor electrode.

In one embodiment, inductance-sensing circuit 2001 may include an LDC or other means to convert an inductance change into a measured value. Inductance-sensing circuit 2001 may also include a counter or timer to measure the oscillator output. Processing device 2010 may further include software components to convert the count value (e.g., inductance value) into a proximity detection decision or relative magnitude. It should be noted however, instead of evaluating raw counts, inductance-sensing circuit 2001 may be evaluating other measurements to determine the user interaction. For example, inductance-sensing circuit 2001 may have a sigma-delta modulator to evaluate a ratio of pulse widths of the output.

In another embodiment, inductance-sensing circuit 2001 includes a TX signal generator to generate a TX signal (e.g., stimulus signal) to be applied to the TX electrode and a receiver (also referred to as a sensing channel), such as an integrator, coupled to measure an RX signal on the RX electrode. In a further embodiment, inductance-sensing circuit 2001 includes an analog-to-digital converter (ADC) coupled to an output of the receiver to convert the measured RX signal to a digital value. The digital value can be further processed by processing device 2010, host 2050, or both.

Processing device 2010 is configured to detect a proximity of a conductive object such as a metallic object, ferrous and non-ferrous conductive metals, or the like. The processing device can detect the proximity of the conductive object using inductance sensor electrode 2021. The inductance sensor electrode can be an inductor or an inductive coil that can be disposed in various configurations, such as a planar inductor, a wire wound inductor, a compressed spring inductor, or the like. In one embodiment, processing 2010 is a microcontroller that obtains inductive sensing data, such as from a sensor, and a detection firmware executing on the microcontroller identifies data to indicate proximity of the conductive object.

In one embodiment, processing device 2010 further includes processing logic 2002. Some or all of the operations of processing logic 2002 may be implemented in firmware, hardware, or software, or some combination thereof. Processing logic 2002 may receive signals from the inductive sensing circuit 2001, and determine a state of inductance sensor electrode 2021, such as whether a conductive object is proximate to the sensor, whether a button has been pushed, the degree to which a button is pushed (e.g., which may determine an amount of deflection of a metal overlay of the button and change the proximity of the metal overlay to the sensor), or the like. In another embodiment, processing logic 2002 may include inductive-sensing circuit 2001.

In another embodiment, instead of performing the operations of processing logic 2002 in processing device 2010, processing device 2010 may send the raw data or partially-processed data to host 2050. Host 2050, as illustrated in FIG. 20, may include decision logic 2051 that performs some or all of the operations of processing logic 2002. Host 2050 may obtain raw inductance data from processing device 2010, and determine if a conductive object is moved into proximity of inductance sensor electrode 2021 (e.g., if a button has been pressed). Operations of decision logic 2051 may be implemented in firmware, hardware, software, or a combination thereof. Host 2050 may include a high-level Application Programming Interface (API) in applications 2052 that perform routines on the received data, such as compensating for sensitivity differences, other compensation algorithms, baseline update routines, start-up and/or initialization routines, interpolation operations, or scaling operations. The operations described with respect to processing logic 2002 may be implemented in decision logic 2051, applications 2052, or in other hardware, software, and/or firmware external to processing device 2010. In some other embodiments, processing device 2010 is the 2050.

In another embodiment, processing device 2010 may also include a non-sensing actions block 2003. Non-sensing actions block 2003 may be used to process and/or receive/transmit data to and from host 2050. For example, additional components may be implemented to operate with processing device 2010 along with inductance sensor electrode 2021.

As illustrated, inductance-sensing circuit 2001 may be integrated into processing device 2010. Inductance-sensing circuit 2001 may include an analog I/O for coupling to an external component, such as a button, a pressure-sensitive touch pad, and/or other devices. In an embodiment, inductance-sensing circuit 2001 is of the Cypress controllers.

It should be noted that the embodiments described herein are not limited to having a configuration of a processing device coupled to a host, but may include a system that measures the inductance on the sensing device and sends the raw data to a host computer where it is analyzed by an application. In another embodiment, the processing that is done by processing device 2010 is done in the host.

The processing device 2010 may reside on a common carrier substrate such as, for example, an integrated circuit (IC) die substrate, or a multi-chip module substrate. Alternatively, the components of to processing device 2010 may be one or more separate integrated circuits and/or discrete components. In one embodiment, processing device 2010 may be the Programmable System on a Chip (PSoC®) processing device, developed by Cypress Semiconductor Corporation, San Jose, California One embodiment of the PSoC® processing device is illustrated and described below with respect to FIG. 21. Alternatively, processing device 2010 may be one or more other processing devices known by those of ordinary skill in the art, such as a microprocessor or central processing unit, a controller, special-purpose processor, digital signal processor (DSP), an application specific integrated circuit (ASIC), a field programmable gate array (FPGA), or other programmable device. In an alternative embodiment, for example, processing device 2010 may be a network processor having multiple processors including a core unit and multiple micro-engines. Additionally, processing device 2010 may include any combination of general-purpose processing device(s) and special-purpose processing device(s).

Inductance-sensing circuit 2001 may be integrated into the IC of processing device 2010, or alternatively, in a separate IC. Alternatively, descriptions of inductance-sensing circuit 2001 may be generated and compiled for incorporation into other integrated circuits. For example, behavioral level code describing inductance-sensing circuit 2001, or portions thereof, may be generated using a hardware descriptive language, such as VHDL or Verilog, and stored to a machine-accessible medium (e.g., CD-ROM, hard disk, floppy disk, etc.). Furthermore, the behavioral level code can be compiled into register transfer level ("RTL") code, a netlist, or even a circuit layout and stored to a machine-accessible medium. The behavioral level code, the RTL code, the netlist, and the circuit layout may represent various levels of abstraction to describe inductance-sensing circuit 2001.

It should be noted that the components of electronic system 2000 may include all the components described above. Alternatively, electronic system 2000 may include some of the components described above.

In one embodiment, electronic system 2000 is used in a tablet computer. Alternatively, the electronic device may be used in other applications, such as a rotary encoder, a linear encoder, MoT applications, a notebook computer, a mobile handset, a personal data assistant ("PDA"), a keyboard, a television, a remote control, a monitor, a handheld multi-media device, a body-wearable device (e.g., a smart watch or the like), a handheld media (audio and/or video) player, a handheld gaming device, a signature input device for point of sale transactions, an eBook reader, global position system ("GPS") or a control panel, among others. The embodiments described herein are not limited to buttons, MoT buttons, or touch-sensor pads for notebook implementations, but can be used in other inductive sensing implementations, for example, the sensing device may be a touch-sensor slider (not shown) or touch-sensor buttons (e.g., inductance sensing buttons). In one embodiment, these sensing devices include one or more inductive sensors or other types of inductance-sensing circuitry. The operations described herein are not limited to notebook pointer operations, but can include other operations, such as lighting control (dimmer), volume control, graphic equalizer control, speed control, or other control operations requiring gradual or discrete adjustments. It should also be noted that these embodiments of inductive sensing implementations may be used in conjunction with non-inductive sensing elements, including but not limited to capacitive sensors, pick buttons, sliders (ex. display brightness and contrast), scroll-wheels, multi-media control (ex. volume, track advance, etc.) handwriting recognition, and numeric keypad operation.

In one embodiment, electronic system 2000 includes a metal over touch (MoT) button (not shown). The MoT button may be one of the MoT buttons described in FIGS. 9-10. Alternatively, the MoT button may be a different MoT button, or may have a different configuration than the MoT buttons described in FIGS. 9-10. In one embodiment, electronic system 2000 includes an inductive button.

Figure 21:
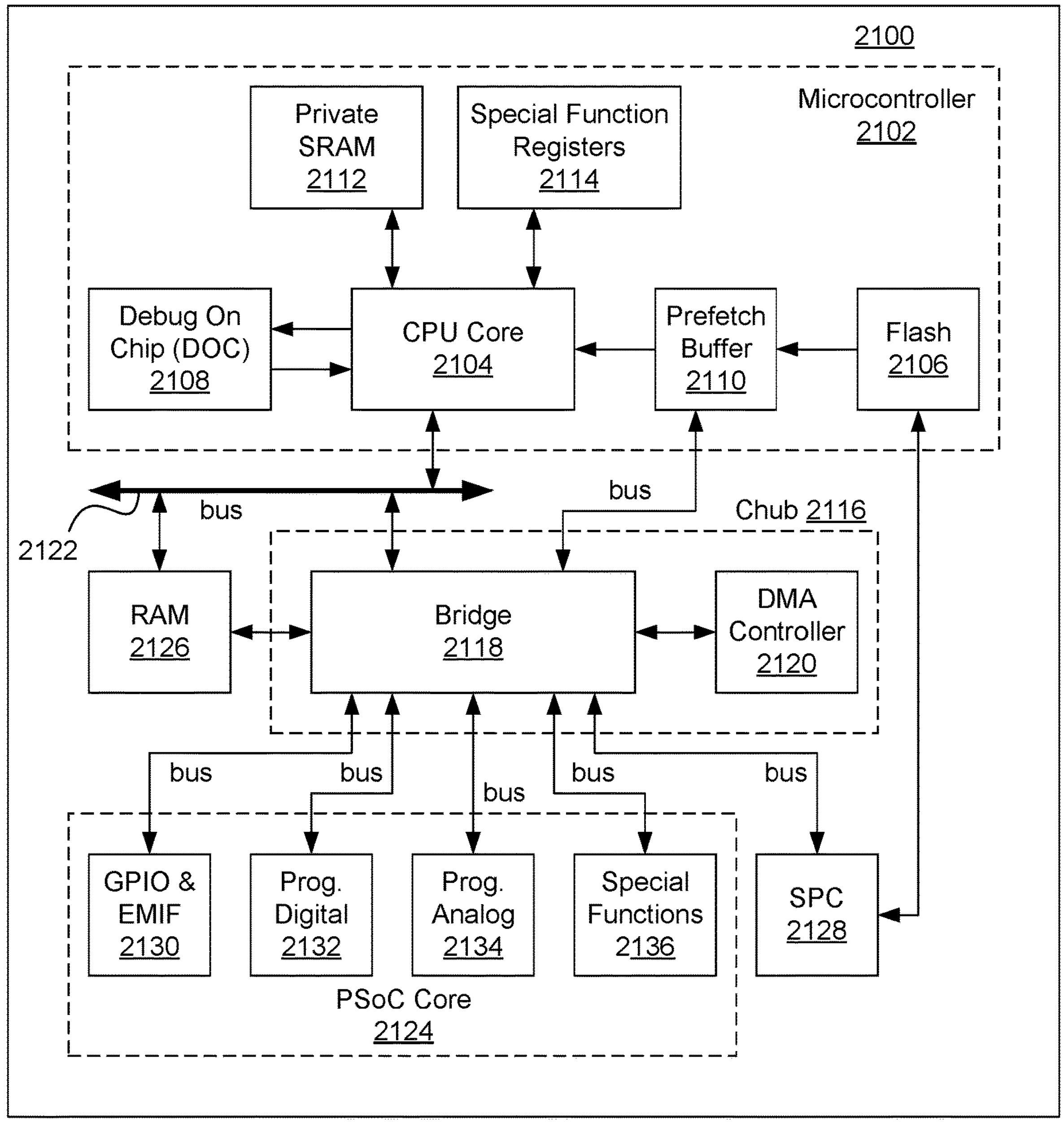
FIG. 21 illustrates an embodiment of a core architecture of the PSoC® processing device, such as that used in the PSoC3® family of products offered by Cypress Semiconductor Corporation (San Jose, California).

FIG. 21 illustrates an embodiment of a core architecture 2100 of the PSoC® processing device, such as that used in the PSoC3® family of products offered by Cypress Semiconductor Corporation (San Jose, California). In one embodiment, the core architecture 2100 includes a microcontroller 2102. The microcontroller 2102 includes a CPU (central processing unit) core 2104, flash program storage 2106, DOC (debug on chip) 2108, a prefetch buffer 2110, a private SRAM (static random access memory) 2112, and special functions registers 2114. In an embodiment, the DOC 2108, prefetch buffer 2110, private SRAM 2112, and special function registers 2114 are coupled to the CPU core 2104 (e.g., CPU core 2006), while the flash program storage 2106 is coupled to the prefetch buffer 2110.

The core architecture 2100 may also include a CHub (core hub) 2116, including a bridge 2118 and a DMA controller 2120 that is coupled to the microcontroller 2102 via bus 2122. The CHub 2116 may provide the primary data and control interface between the microcontroller 2102 and its peripherals (e.g., peripherals) and memory, and a programmable core 2124. The DMA controller 2120 may be programmed to transfer data between system elements without burdening the CPU core 2104. In various embodiments, each of these subcomponents of the microcontroller 2102 and CHub 2116 may be different with each choice or type of CPU core 2104. The CHub 2116 may also be coupled to shared SRAM 2126 and an SPC (system performance controller) 2128. The private SRAM 2112 is independent of the shared SRAM 2126 that is accessed by the microcontroller 2102 through the bridge 2118. The CPU core 2104 accesses the private SRAM 2112 without going through the bridge 2118, thus allowing local register and RAM accesses to occur simultaneously with DMA access to shared SRAM 2126. Although labeled here as SRAM, these memory modules may be any suitable type of a wide variety of (volatile or non-volatile) memory or data storage modules in various other embodiments.

In various embodiments, the programmable core 2124 may include various combinations of subcomponents (not shown), including, but not limited to, a digital logic array, digital peripherals, analog processing channels, global routing analog peripherals, DMA controller(s), SRAM and other appropriate types of data storage, IO ports, and other suitable types of subcomponents. In one embodiment, the programmable core 2124 includes a GPIO (general purpose TO) and EMIF (extended memory interface) block 2130 to provide a mechanism to extend the external off-chip access of the microcontroller 2102, a programmable digital block 2132, a programmable analog block 2134, and a special functions block 2136, each configured to implement one or more of the subcomponent functions. In various embodiments, the special functions block 2136 may include dedicated (non-programmable) functional blocks and/or include one or more interfaces to dedicated functional blocks, such as USB, a crystal oscillator drive, JTAG, and the like.

The programmable digital block 2132 may include a digital logic array including an array of digital logic blocks and associated routing. In one embodiment, the digital block architecture is comprised of UDBs (universal digital blocks). For example, each UDB may include an ALU together with CPLD functionality.

In various embodiments, one or more UDBs of the programmable digital block 2132 may be configured to perform various digital functions, including, but not limited to, one or more of the following functions: a basic I2C slave; an I2C master; a SPI master or slave; a multi-wire (e.g., 3-wire) SPI master or slave (e.g., MISO/MOSI multiplexed on a single pin); timers and counters (e.g., a pair of 8-bit timers or counters, one 16 bit timer or counter, one 8-bit capture timer, or the like); PWMs (e.g., a pair of 8-bit PWMs, one 16-bit PWM, one 8-bit deadband PWM, or the like), a level sensitive I/O interrupt generator; a quadrature encoder, a UART (e.g., half-duplex); delay lines; and any other suitable type of digital function or combination of digital functions which can be implemented in a plurality of UDBs.

In other embodiments, additional functions may be implemented using a group of two or more UDBs. Merely for purposes of illustration and not limitation, the following functions can be implemented using multiple UDBs: an I2C slave that supports hardware address detection and the ability to handle a complete transaction without CPU core (e.g., CPU core 2104) intervention and to help prevent the force clock stretching on any bit in the data stream; an I2C multi-master which may include a slave option in a single block; an arbitrary length PRS or CRC (up to 32 bits); SDIO; SGPIO; a digital correlator (e.g., having up to 32 bits with 4× over-sampling and supporting a configurable threshold); a LINbus interface; a delta-sigma modulator (e.g., for class D audio DAC having a differential output pair); an I2S (stereo); an LCD drive control (e.g., UDBs may be used to implement timing control of the LCD drive blocks and provide display RAM addressing); full-duplex UART (e.g., 7-, 8- or 9-bit with 1 or 2 stop bits and parity, and RTS/CTS support), an IRDA (transmit or receive); capture timer (e.g., 16-bit or the like); deadband PWM (e.g., 16-bit or the like); an SMbus (including formatting of SMbus packets with CRC in software); a brushless motor drive (e.g., to support 6/12 step commutation); auto BAUD rate detection and generation (e.g., automatically determine BAUD rate for standard rates from 1200 to 115200 BAUD and after detection to generate required clock to generate BAUD rate); and any other suitable type of digital function or combination of digital functions which can be implemented in a plurality of UDBs.

The programmable analog block 2134 may include analog resources including, but not limited to, comparators, mixers, PGAs (programmable gain amplifiers), TIAs (trans-impedance amplifiers), ADCs (analog-to-digital converters), DACs (digital-to-analog converters), voltage references, current sources, sample and hold circuits, and any other suitable type of analog resources. The programmable analog block 2134 may support various analog functions including, but not limited to, analog routing, LCD drive IO support, capacitance-sensing, voltage measurement, motor control, current to voltage conversion, voltage to frequency conversion, differential amplification, light measurement, inductive position monitoring, filtering, voice coil driving, magnetic card reading, acoustic doppler measurement, echo-ranging, modem transmission and receive encoding, or any other suitable type of analog function.

The embodiments described above allow for an inductive sensor electrode to sense or detect when a conductive object such as a ferrous or non-ferrous metal is proximate to the sensor. The inductive sensor described herein allow for low-cost designs as well as small form factors for inductive-sensing buttons, such as metal over touch (MoT) buttons.

The embodiments described herein may be used in various designs of mutual-inductance sensing systems, in self-inductance sensing systems, or combinations of both. In one embodiment, the inductance sensing system detects sense elements that are activated in an array and analyzes a signal pattern on the neighboring sense elements to separate noise from actual signal. The embodiments described herein are not tied to a particular inductive sensing solution and can be used as well with other sensing solutions, including optical sensing solutions and capacitive sensing solutions, as would be appreciated by one of ordinary skill in the art having the benefit of this disclosure.

In the above description, some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "receiving," "adjusting," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an embodiment" or "one embodiment" throughout is not intended to mean the same embodiment or embodiment unless described as such.

Embodiments descried herein may also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store one or more sets of instructions. The term "computer-readable medium" shall also be taken to include any medium that is capable of storing, encoding, or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the embodiments as described herein.

The above description sets forth numerous specific details such as examples of specific systems, components, methods, and so forth, in order to provide a good understanding of several embodiments of the present disclosure. It is to be understood that the above description is intended to be illustrative and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. An apparatus comprising:

a plurality of inductive elements;

an inductive measurement circuit comprising:

a multiplexer coupled to the plurality of inductive elements;

a voltage bias circuit coupled to the plurality of inductive elements; and a capacitor coupled between the voltage bias circuit and an output of the multiplexer, wherein the multiplexer is to selectively couple an inductive element of the plurality of inductive elements to the capacitor, wherein the inductive measurement circuit is to output a first signal with a first frequency, and wherein the first signal is associated with an inductance change of the inductive element; and a feedback circuit comprising:

a first transistor coupled to the output of the multiplexer, wherein the first transistor is to receive the first signal;

a second transistor coupled between the first transistor and a third transistor; and the third transistor coupled to a ground potential, wherein the feedback circuit is to detect a first level of the first signal at the first transistor and reduce the first level to a second level responsive to detecting the first level at the first transistor; and a frequency divider circuit coupled to the inductive measurement circuit, wherein the frequency divider circuit is configured to generate a second signal with a second frequency that is lower than the first frequency.

2. The apparatus of claim 1, wherein the frequency divider circuit comprises:

a comparator coupled to an output of the feedback circuit, wherein the comparator is to generate a third signal with the first frequency;

a plurality of latch circuits coupled to an output of the comparator, wherein the plurality of latch circuits is to generate a fourth signal with a third frequency based on the third signal; and a divider chain coupled to the plurality of latch circuits, wherein the divider chain is to generate the second signal with the second frequency based on the fourth signal.

3. The apparatus of claim 2, wherein the comparator is referenced to a bias voltage of the voltage bias circuit.

4. The apparatus of claim 2, wherein the comparator is a self-biased comparator.

5. The apparatus of claim 1, further comprising a Colpitts oscillator comprising the plurality of inductive elements.

6. The apparatus of claim 1, wherein the inductive element of the plurality of inductive elements is to provide a direct current (DC) bias point to the second transistor.

7. The apparatus of claim 1, wherein the first signal is a sinusoidal signal, and the second signal is a square wave signal.

8. The apparatus of claim 1, wherein the first signal is a sinusoidal signal, and the second signal is a sawtooth signal.

9. The apparatus of claim 1, wherein the multiplexer is part of an analog multiplexer bus.

10. The apparatus of claim 1, wherein the feedback circuit further comprises an automatic gain control (AGC) block coupled between drains of the first transistor and the second transistor, wherein the AGC block is to limit an operating current to the first transistor and the second transistor to maintain sinusoidal operation.

11. The apparatus of claim 1, further comprising a counter coupled to an output of the frequency divider circuit, wherein the counter is to provide a digital value based on the second signal.

12. An apparatus comprising:

an inductive measurement circuit comprising:

a multiplexer configured to couple to a plurality of inductive elements;

a voltage bias circuit configured to couple to the plurality of inductive elements; and a capacitor coupled between the voltage bias circuit and an output of the multiplexer, wherein the multiplexer is to selectively couple an inductive element of the plurality of inductive elements to the capacitor, wherein the inductive measurement circuit is to output a first signal with a first frequency, and wherein the first signal is associated with an inductance change of the inductive element;

a first transistor coupled to the output of the multiplexer, wherein the first transistor is to receive the first signal;

a second transistor coupled between the first transistor and a third transistor; and the third transistor coupled to a ground potential;

a circuit coupled to the first transistor, the second transistor, and the third transistor, wherein the circuit is to maintain an operating current to the first transistor and the second transistor to maintain sinusoidal operation; and a frequency divider circuit coupled to the inductive measurement circuit, wherein the frequency divider circuit is configured to generate a second signal with a second frequency that is lower than the first frequency.

13. The apparatus of claim 12, wherein the circuit comprises an automatic gain control (AGC) circuit coupled between drains of the first transistor and the second transistor, wherein the AGC circuit is to limit the operating current to the first transistor and the second transistor to maintain the sinusoidal operation.

14. The apparatus of claim 12, wherein the circuit is to detect a first level of the first signal at the first transistor and reduce the first level to a second level responsive to detecting the first level at the first transistor.

15. The apparatus of claim 12, wherein the frequency divider circuit comprises:

a comparator coupled to an output of the inductive measurement circuit, wherein the comparator is to generate a third signal with the first frequency;

a plurality of latch circuits coupled to an output of the comparator, wherein the plurality of latch circuits is to generate a fourth signal with a third frequency based on the third signal; and a divider chain coupled to the plurality of latch circuits, wherein the divider chain is to generate the second signal with the second frequency based on the fourth signal.

16. The apparatus of claim 15, wherein the comparator is referenced to a bias voltage of the voltage bias circuit.

17. The apparatus of claim 12, wherein the first signal is a sinusoidal signal, and the second signal is a square wave signal.

18. The apparatus of claim 12, wherein the first signal is a sinusoidal signal, and the second signal is a sawtooth signal.

* * * * *